(12) United States Patent
Cho et al.

(10) Patent No.: US 12,713,580 B2
(45) Date of Patent: Aug. 18, 2026

(54) SEMICONDUCTOR DEVICE AND MANUFACTURING METHOD THEREFOR

(71) Applicant: Samsung Electronics Co., Ltd., Suwon-si (KR)

(72) Inventors: Byunghoon Cho, Suwon-si (KR); Namjung Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 18/226,049

(22) Filed: Jul. 25, 2023

(65) Prior Publication Data

US 2024/0155828 A1 May 9, 2024

(30) Foreign Application Priority Data

Nov. 7, 2022 (KR) ........................ 10-2022-0147381

(51) Int. Cl.
*H10B 12/00* (2023.01)

(52) U.S. Cl.
CPC ......... *H10B 12/315* (2023.02); *H10B 12/033* (2023.02); *H10B 12/50* (2023.02)

(58) Field of Classification Search
CPC ...... H10B 12/033; H10B 12/30; H10B 12/03; H10B 12/09; H10B 12/31; H10B 12/315; H10D 1/716; H10D 1/692
See application file for complete search history.

(56) References Cited

U.S. PATENT DOCUMENTS

| | | | | |
|---|---|---|---|---|
| 8,710,624 | B2 | 4/2014 | Tonari | |
| 8,993,396 | B2 | 3/2015 | Park et al. | |
| 9,105,758 | B2 | 8/2015 | Kim | |
| 9,627,468 | B2 | 4/2017 | Che et al. | |
| 10,121,793 | B2 | 11/2018 | Kim et al. | |
| 10,332,888 | B2 | 6/2019 | Liu et al. | |
| 11,374,087 | B2 | 6/2022 | Kim | |
| 2011/0045650 | A1 | 2/2011 | Maekawa | |
| 2015/0372137 | A1 | 12/2015 | Sakogawa | |
| 2020/0176556 | A1 * | 6/2020 | Lee | H10D 1/716 |
| 2021/0272959 | A1 * | 9/2021 | Kim | H10D 1/692 |
| 2022/0238637 | A1 | 7/2022 | Wu et al. | |

FOREIGN PATENT DOCUMENTS

| | | | |
|---|---|---|---|
| KR | 10-2021-0110969 | A | 9/2021 |
| KR | 10-2022-0083386 | A | 6/2022 |
| TW | 202205601 | A | 2/2022 |

* cited by examiner

*Primary Examiner* — Edward Chin
(74) *Attorney, Agent, or Firm* — Muir Patent Law, PLLC

(57) ABSTRACT

A semiconductor device includes a substrate including a first area and a second area planarly surrounding the first area, a lower electrode disposed on the first area of the substrate and extending in a vertical direction, a supporter surrounding a sidewall of the lower electrode and supporting the lower electrode, a first upper electrode covering the lower electrode, on the lower electrode, the first upper electrode including a first portion disposed within the first area and a second portion disposed within the second area, a dielectric layer arranged between the lower electrode and the first upper electrode, and a second upper electrode disposed on the first portion of the first upper electrode, wherein the second upper electrode is not disposed on the second portion of the first upper electrode.

20 Claims, 20 Drawing Sheets

200
182
181
UE1_1
UE1_2
UE1
250
180
PCC
240
127P
232
231
216
214
212
218
114
PTR
AC3
PCA
113
BR
AC2
CR2
AC1
CR1
CR
MCA
170
UE2
144P
160
144H
UE1
160
LE
142P
142H
126P
126H
124
120
112
110
CP
CTR
Z
Y
X

SEMICONDUCTOR DEVICE AND MANUFACTURING METHOD THEREFOR

CROSS-REFERENCE TO RELATED APPLICATION

This application is based on and claims priority under 35 U.S.C. § 119 to Korean Patent Application No. 10-2022-0147381, filed on Nov. 7, 2022, in the Korean Intellectual Property Office, the disclosure of which is incorporated by reference herein in its entirety.

BACKGROUND

The inventive concept relates to a semiconductor device and a manufacturing method for the semiconductor device, and more particularly, to a semiconductor device including a capacitor and a manufacturing method for the semiconductor device.

With the downscaling of the semiconductor device, a size of individual fine circuit patterns for implementing a semiconductor device has been further reduced. As the size of individual fine circuit patterns increases, heights of cell capacitors and peripheral circuit contacts increase. Accordingly, misalignment defects may occur in a process of forming peripheral circuit contacts.

SUMMARY

The inventive concept provides a semiconductor device with improved reliability.

The objectives to be resolved by the technical idea are not limited to the objectives described above, and other objectives not mentioned will be clearly understood by those skilled in the art from the following description.

According to embodiments according to the inventive concept, a semiconductor device may be provided. The semiconductor device includes a substrate including a first area and a second area planarly surrounding the first area, a lower electrode disposed on the first area of the substrate and extending in a vertical direction, a supporter surrounding a sidewall of the lower electrode and supporting the lower electrode, a first upper electrode covering the lower electrode, on the lower electrode, the first upper electrode including a first portion disposed within the first area and a second portion disposed within the second area, a dielectric layer arranged between the lower electrode and the first upper electrode, and a second upper electrode disposed on the first portion of the first upper electrode, wherein the second upper electrode is not disposed on the second portion of the first upper electrode.

According to embodiments according to the inventive concept, a semiconductor device may be provided. The semiconductor device includes a substrate including a cell area and a connection area, the cell area including a first area and a second area, the second area being arranged between the first area and the connection area, a plurality of conductive patterns disposed on the cell area of the substrate, a plurality of lower electrodes respectively connected to the plurality of conductive patterns and each extending in a vertical direction, a plurality of supporters surrounding each of a plurality of sidewalls of the plurality of lower electrodes and supporting the plurality of lower electrodes, a dielectric layer disposed on the plurality of lower electrodes and the plurality of supporters and not disposed within the connection area, a first upper electrode disposed on the dielectric layer, the first upper electrode including a first portion disposed within the first area and a second portion disposed within the second area, and a second upper electrode disposed within the first area and not disposed within the second area and the connection area.

According to embodiments according to the inventive concept, a semiconductor device may be provided. The semiconductor device includes a substrate including a cell area, a connection area, and a peripheral circuit area, the cell area including a first area and a second area, the second area being arranged between the first area and the connection area, a cell transistor disposed within the cell area of the substrate, a peripheral circuit disposed within the peripheral circuit area of the substrate, a capacitor disposed within the cell area of the substrate and electrically connected to the cell transistor, and a peripheral circuit contact disposed within the peripheral circuit area of the substrate and electrically connected to the peripheral circuit, wherein the capacitor includes a lower electrode disposed on the first area of the substrate and extending in a vertical direction, a plurality of supporters surrounding a sidewall of the lower electrode and supporting the lower electrode, a first upper electrode covering the lower electrode, on the lower electrode, the first upper electrode including a first portion disposed within the first area and a second portion disposed within the second area, a dielectric layer arranged between the lower electrode and the first upper electrode, and a second upper electrode disposed on the first portion of the first upper electrode, wherein the second upper electrode is not disposed on the second portion of the first upper electrode.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
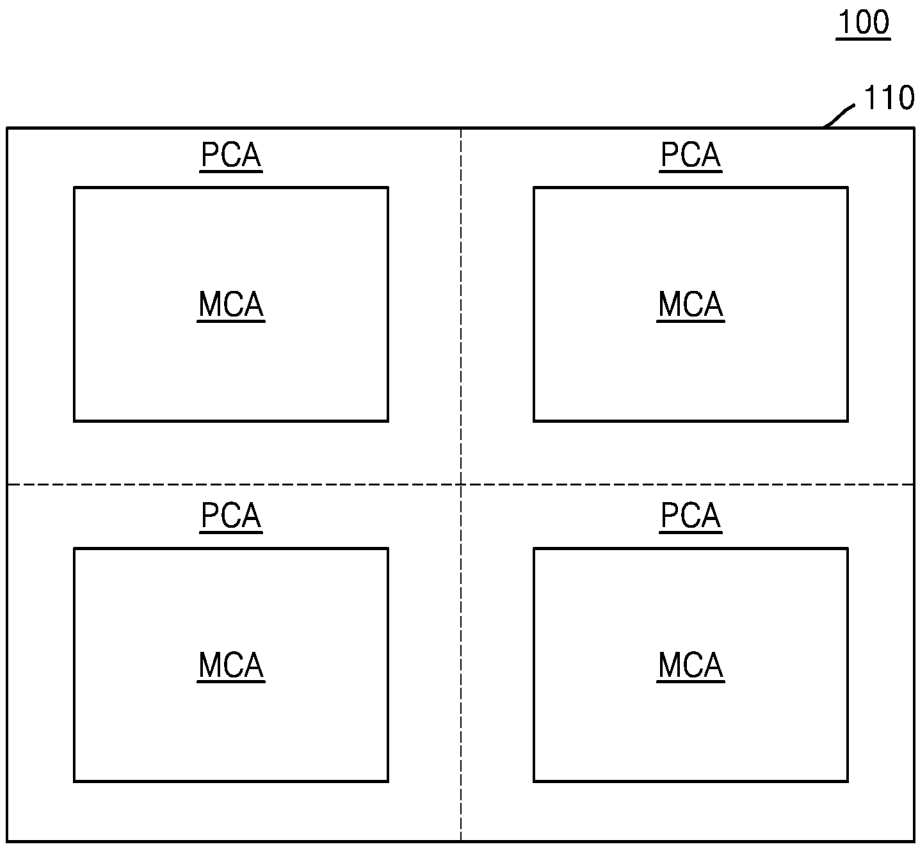
FIG. 1 is a schematic layout diagram of a semiconductor device according to embodiments of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of die associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below." "lower" "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle nay have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Hereinafter, embodiments are described in detail with reference to the accompanying drawings.

FIG. 1 is a layout diagram illustrating a semiconductor device 100 according to embodiments of the inventive concept.

Referring to FIG. 1, the semiconductor device 100 may include a substrate 110 including a cell array area MCA and a peripheral circuit area PCA. The cell array area MCA may be a memory cell area of a dynamic random-access memory (DRAM) element, and the peripheral circuit area PCA may be a core area or peripheral circuit area of the DRAM element. For example, the cell array area MCA may include a cell transistor CTR and a capacitor connected to the cell transistor CTR, and the peripheral circuit area PCA may include a peripheral circuit transistor for transferring a signal and/or power to the cell transistor CTR included in the cell array area MCA. In embodiments, the peripheral circuit transistor may configure various circuits, such as a command decoder, a control logic, an address buffer, a row decoder, a column decoder, a sense amp, data, or an input/output circuit.

Figure 2:
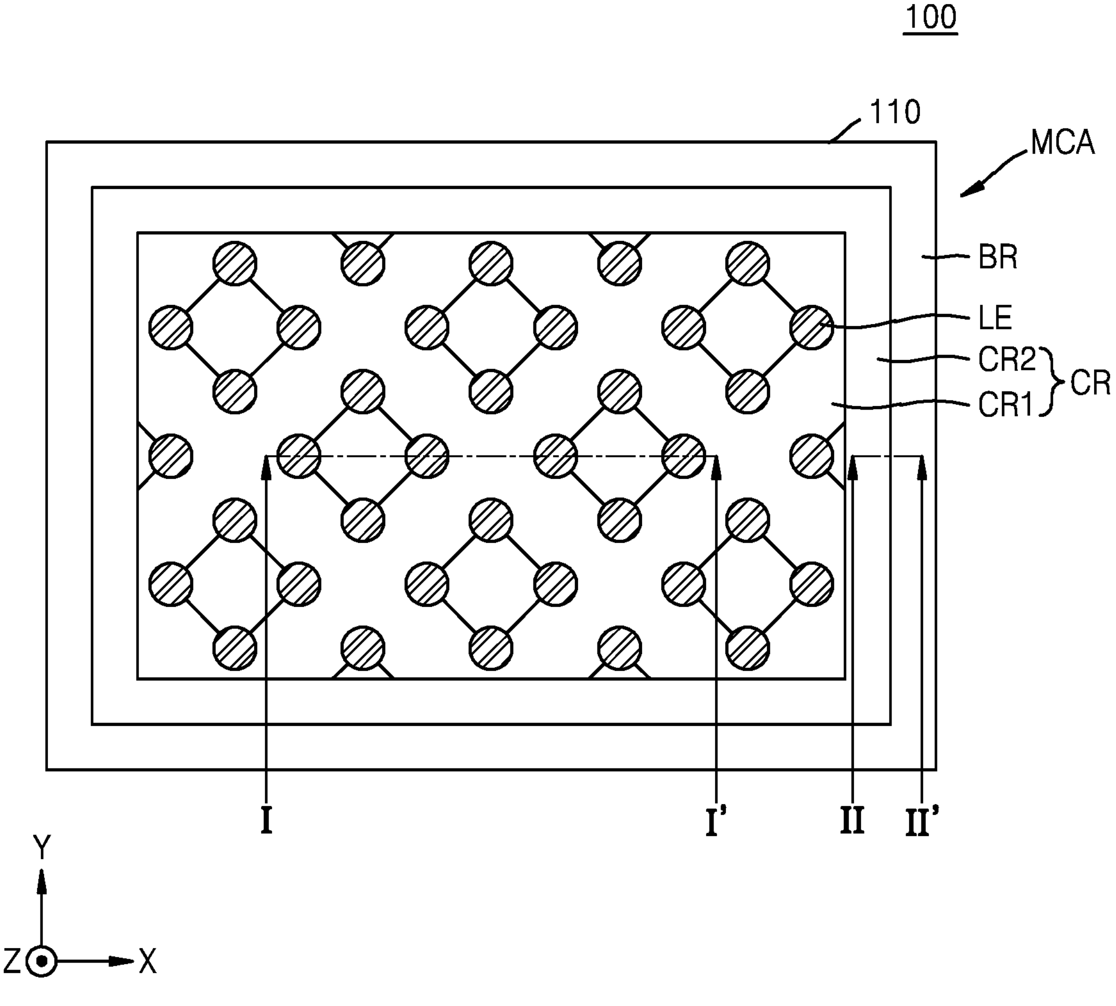
FIG. 2 is a schematic layout diagram of a semiconductor device according to embodiments of the inventive concept.
Figure 3:
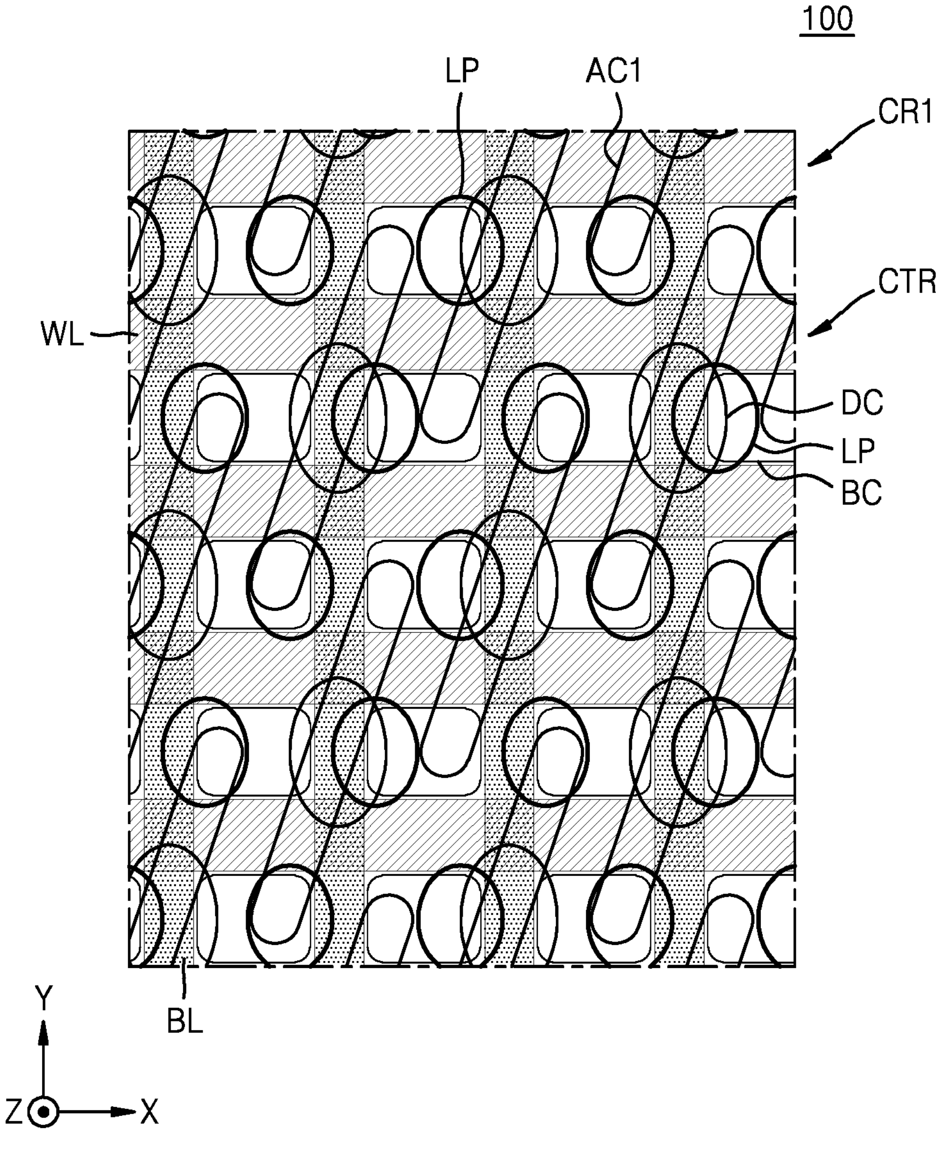
FIG. 3 is a plan view schematically illustrating a partial configuration of a semiconductor device according to embodiments of the inventive concept.

FIG. 2 is a schematic layout diagram of the semiconductor device 100 according to embodiments of the inventive concept. Specifically, FIG. 2 is a schematic layout diagram of the cell array area MCA of the semiconductor device 100 shown in FIG. 1. FIG. 3 is a plan view schematically illustrating a partial configuration of the semiconductor device 100 according to embodiments of the inventive concept. Specifically, FIG. 3 is a plan view schematically illustrating a partial configuration arranged in a first area CR1 of the semiconductor device 100 shown in FIG. 2. FIGS. 4 to 8 are cross-sectional views schematically illustrating partial configurations of semiconductor devices 100A, 100B, 100C, 100D, and 100E, respectively, according to embodiments of the inventive concept. Specifically, FIGS. 4 to 8 are cross-sectional views of the semiconductor devices 100A, 100B, 100C, 100D, and 100E corresponding to a cross-section taken along lines I-I' and II-II' in FIG. 2.

Referring to FIG. 2, the substrate 110 including a cell area CR and a connection area BR may be provided. Specifically, the cell array area MCA of the semiconductor device 100 may include the cell area CR and the connection area BR, and the cell area CR may include a first area CR1 and a second area CR2. The first area CR1 may be defined by the second area CR2. Specifically, the first area CR1 may be surrounded by the second area CR2. The cell area CR may be surrounded by the connection area BR. The second area CR2 may be arranged between the first area CR1 and the connection area BR. The connection area BR may be an area for connecting a structure arranged in the cell area CR to a structure of the peripheral circuit area PCA. The first area CR1 may be spaced apart from the connection area BR with the second area CR2 therebetween. The second area CR2 may be surrounded by the connection area BR.

As shown in FIG. 2, a plurality of lower electrodes LE may be disposed within the first area CR1 of the substrate 110. Specifically, FIG. 2 shows an example of a configuration of a roughly rhombic planar shape having vertices respectively formed at four adjacent lower electrodes LE. However, a planar arrangement of the plurality of lower electrodes LE is not limited to the example shown in FIG. 2, and may be variously deformed and modified within the scope of the inventive concept.

Referring to FIG. 3, the semiconductor device 100 may include a plurality of cell transistors CTR in the first area CR1 of the substrate 110. Specifically, the semiconductor device 100 may include a plurality of first active areas AC1 arranged to horizontally extend in an oblique direction with respect to a first horizontal direction (X direction) and a second horizontal direction (Y direction) in a plan view. A plurality of word lines WL may extend in parallel to each other in the first horizontal direction (X direction) across the plurality of first active areas AC1. Over the plurality of word lines WL, a plurality of bit lines BL may each extend in parallel to each other in the second horizontal direction (Y direction) crossing the first horizontal direction (X direction). The plurality of bit lines BL may be connected to the first active area AC1 through the respective direct contacts DC.

A plurality of buried contacts BC may be arranged between two adjacent bit lines BL from among the plurality of bit lines BL. A plurality of conductive landing pads LP may be disposed over the plurality of buried contacts BC. The plurality of conductive landing pads LP may be arranged to overlap at least part of the buried contacts BC, respectively. The plurality of lower electrodes LE may be arranged to be spaced apart from each other over the plurality of conductive landing pads LP. The plurality of lower electrodes LE may be connected to the plurality of first active areas AC1 through the plurality of buried contacts BC and the plurality of conductive landing pads LP.

Figure 4:
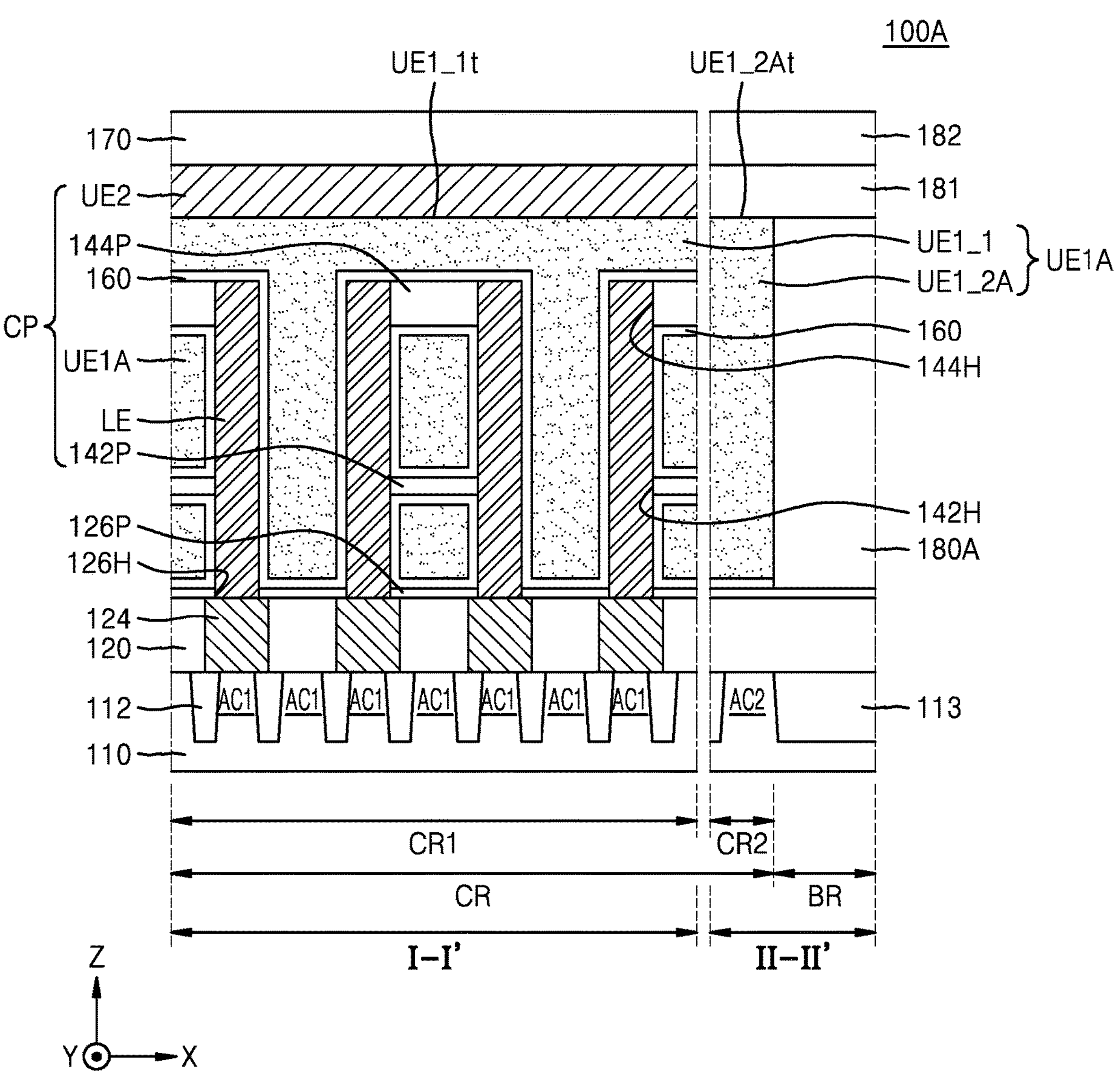
FIGS. 4 to 8 are cross-sectional views schematically illustrating a partial configuration of a semiconductor device according to embodiments of the inventive concept.

Referring to FIG. 4, the semiconductor device 100A may include the substrate 110 including the cell area CR and the connection area BR. Specifically, the semiconductor device 100A may include the substrate 110 including the first area CR1, the second area CR2, and the connection area BR.

The substrate 110 may include silicon, for example, monocrystalline silicon, polycrystalline silicon, or amorphous silicon. In some other embodiments, the substrate 110 may include at least one selected from among germanium (Ge), silicon-germanium (SiGe), silicon carbide (SiC), gallium arsenide (GaAs), indium arsenide (InAs), and indium phosphide (InP). In some embodiments, the substrate 110 may include a conductive area, for example, a well doped with impurities or a structure doped with impurities.

In some embodiments, an element isolation layer 112 defining a plurality of active areas may be provided in the substrate 110. The element isolation layer 112 may include an oxide layer, a nitride layer, or a combination thereof. In some embodiments, the element isolation layer 112 may have various structures, such as a shallow trench isolation (STI) structure. Specifically, within the substrate 110, the first active area AC1 may be formed in the first area CR1, and a second active area AC2 may be formed in the second area CR2. The first active area AC1 may be defined by the element isolation layer 112. The second active area AC2 may be defined by the element isolation layer 112 and a connection isolation layer 113.

In some embodiments, the connection isolation layer 113 may be provided in the substrate 110 of the connection area BR. The connection isolation layer 113 may include an oxide layer, a nitride layer, or a combination thereof. The connection isolation layer 113 may have various structures, such as an STI structure. Although not shown, the connection isolation layer 113 may include a plurality of layers. For example, the connection isolation layer 113 may include a first connection liner (not shown), a second connection liner (not shown), and a connection buried insulating layer (not shown).

In some embodiments, the semiconductor device 100A may include a lower structure 120 and a plurality of conductive patterns 124 on the substrate 110 of the cell area CR. Specifically, the semiconductor device 100A may include the lower structure 120 and the plurality of conductive patterns 124 on the substrate 110 of the first area CR1. In the first area CR1, the plurality of conductive patterns 124 may be connected to the plurality of active areas AC1 by passing through the lower structure 120. In some embodiments, the plurality of conductive patterns 124 may not be arranged in the second area CR2 and/or the connection area BR.

In some embodiments, the lower structure 120 may include an insulating layer including a silicon oxide layer, a silicon nitride layer, or a combination thereof. In some other embodiments, the lower structure 120 may include various conductive areas, for example, a wiring layer, a contact plug, a transistor, etc., and an insulating layer for insulating the conductive areas from each other. The lower structure 120 may include the plurality of bit lines BL described with reference to FIG. 3.

In some embodiments, the plurality of conductive patterns 124 may include a polysilicon, a metal, a conductive metal nitride, a metal silicide, or a combination thereof. Each of the plurality of conductive patterns 124 may include the buried contact BC and the conductive landing pads LP, which are described with reference to FIG. 3.

In some embodiments, a first insulating pattern 126P having a plurality of openings 126H overlapping the plurality of conductive patterns 124 in a horizontal direction (Z direction) may be disposed on the lower structure 120 and the plurality of conductive patterns 124 in the cell area CR. Specifically, the first insulating pattern 126P may include a silicon compound layer such as a silicon nitride (SiN) layer, a silicon carbon nitride (SiCN) layer, a silicon boron nitride layer (SiBN), or a combination thereof. The terms "SiN", "SiCN", and "SiBN" used herein denote materials including elements included in each of the terms, and are not chemical formulas representing stoichiometric relationships. In some embodiments, the first insulating pattern 126P may extend to the connection area BR and be disposed on the substrate 110.

In some embodiments, a plurality of capacitors CP may be disposed on the plurality of conductive patterns 124 in the cell area CR. Each of the plurality of capacitors CP may include a lower electrode LE extending in a vertical direction (Z direction) with respect to the upper surface of the substrate 110, supporters 142P and 144P surrounding sidewalls of the lower electrodes LE and supporting the lower electrode LE, a dielectric layer 160 disposed on the lower electrode LE and the supporters 142P and 144P, a first upper electrode UE1A disposed on the dielectric layer 160 and the lower electrodes LE, and a second upper electrode UE2 disposed on the first upper electrode UE1A.

The first insulating pattern 126P may be arranged to be adjacent to a lower end of each of the plurality of lower electrodes LE. Each of the plurality of lower electrodes LE may have a pillar shape extending in a direction away from the substrate 110 in the vertical direction (Z direction) through the opening 126H of the first insulating pattern 126P from an upper surface of the conductive pattern 124. As described above, the lower electrodes LE may be arranged in the first area CR1 and may not be arranged within the second area CR2. Although a case in which each of the plurality of lower electrodes LE has a pillar shape is described as an example, the inventive concept is not limited thereto. For example, each of the plurality of lower electrodes LE may have a cross-sectional structure of a cup shape or a cylinder shape with a closed bottom.

In the cell area CR, the plurality of lower electrodes LE may be supported by the lower supporter 142P and the upper supporter 144P. The plurality of lower electrodes LE and the first upper electrode UE1A may face each other with the dielectric layer 160 therebetween.

In the cell area CR, the upper supporter 144P may extend parallel to the substrate 110 while surrounding an upper end of each of the plurality of lower electrodes LE. The upper supporter 144P may be disposed above the substrate 110 within the first area CR1 and may not be disposed above the substrate 110 within the second area CR2. A plurality of holes 144H through which the plurality of lower electrodes LE pass through may be defined in the upper supporter 144P. An inner side wall of each of the plurality of holes 144H defined in the upper supporter 144P may be in contact with an outer side wall of the lower electrode LE. An upper surface of each of the plurality of lower electrodes LE may be on the same plane on which an upper surface of the upper supporter 144P is disposed.

In the cell area CR, the lower supporter 142P may extend parallel to the substrate 110 between the substrate 110 and the upper supporter 144P and be in contact with outer side walls of the plurality of lower electrodes LE. The lower supporter 142P may be disposed above the substrate 110 within the first area CR1 and may not be disposed above the substrate 110 within the second area CR2. A plurality of holes 142H through which the plurality of lower electrodes LE pass through may be defined in the lower supporter 142P. Each of the plurality of lower electrodes LE may extend in the horizontal direction (Z direction) through the plurality of holes 144H defined in the upper supporter 144P and the plurality of holes 142H defined in the lower supporter 142P.

Each of the lower supporter 142P and the upper supporter 144P may include a compound of a metalloid and at least one reactive non metal, such as a compound comprising silicon and nitrogen, such as a SiN layer, a SiCN layer, a SiBN layer, or a combination thereof. In embodiments, the lower supporter 142P and the upper supporter 144P may include the same material as each other. In other embodiments, the lower supporter 142P and the upper supporter 144P may include different materials from each other. For example, each of the lower supporter 142P and the upper supporter 144P may include SiCN. In another example, the lower supporter 142P may include SiCN, and the upper supporter 144P may include SiBN. However, the inventive concept is not limited to the materials described above.

The lower electrode LE may include a metal layer, a conductive metal oxide layer, a conductive metal nitride layer, a conductive metal oxynitride, or a combination thereof, such as where the metal is an early transition metal, late transition metal, post transition metal or combinations thereof. Conductive oxide, nitride or oxynitride compounds where a transition metal and post transition metal are present, or where a transition metal and an alkaline earth metal are present, are also contemplated. In embodiments, the lower electrode LE may include titanium (Ti), a Ti oxide, a Ti nitride, a Ti oxynitride, niobium (Nb), a Nb oxide, a Nb nitride, a Nb oxynitride, cobalt (Co), a Co oxide, a Co nitride, a Co oxynitride, tin (Sn), a Sn oxide, a Sn nitride, a Sn oxynitride, or a combination thereof. For example, the lower electrode LE may include niobium nitride (NbN), titanium nitride (TiN), cobalt nitride (CoN), tin oxide ($SnO_2$), or a combination thereof. In other embodiments, the lower electrodes LE may include tantalum nitride (TaN), titanium aluminum nitride (TiAlN), tantalum aluminum nitride (TaAlN), tungsten (W), ruthenium (Ru), ruthenium oxide ($RuO_2$), monostrontium ruthenate ($SrRuO_3$), iridium (Ir), iridium oxide ($IrO_2$), platinum (Pt), platinum oxide (PtO), SRO($SrRuO_3$), BSRO((Ba,Sr)$RuO_3$), CRO ($CaRuO_3$), LSCO((La,Sr)$CoO_3$, or a combination thereof. However, a material included in the lower electrode LE is not limited to those described above.

In some embodiments, the dielectric layer 160 may be disposed on the lower electrode LE and the supporters. For example, the dielectric layer 160 conformally covering the lower electrode LE, the lower supporter 142P, and the upper supporter 144P may be provided. The dielectric layer 160 may be provided within the first area CR1 and the second area CR2 of the substrate 110.

The dielectric layer 160 may include a high dielectric constant layer. The term "high dielectric constant layer" used herein denotes a dielectric layer having a greater dielectric constant than that of a silicon oxide layer. In embodiments, the dielectric layer 160 may include a metal oxide including at least one metal selected from among hafnium (Hf), zirconium (Zr), aluminum (Al), Nb, cerium (Ce), lanthanum (La), tantalum (Ta), and Ti. In some embodiments, the dielectric layer 160 may have a single-layer structure including one high-k dielectric layer. In other embodiments, the dielectric layer 160 may have a multi-layer structure including a plurality of high-k dielectric layers. The high-k dielectric layer may include hafnium oxide ($HfO_2$), zirconium dioxide ($ZrO_2$), aluminum oxide ($Al_2O_3$), lanthanum oxide ($La_2O_3$), tantalum pentoxide ($Ta_2O_3$), niobium oxide ($Nb_2O_5$), ceric oxide ($CeO_2$), titanium dioxide ($TiO_2$), germanium dioxide ($GeO_2$), or a combination thereof, but is not limited thereto.

In some embodiments, the dielectric layer 160 may include at least one of a ferroelectric material layer, an antiferroelectric material layer, and a paraelectric material layer. For example, the dielectric layer 160 may include hafnium zirconium oxide ($HfZrO_2$), $ZrO_2$, lead titanium oxide ($PbTiO_3$), silver niobium oxide ($AgNbO_3$), $HfO_2$, $ZrO_2$, $TiO_2$, $Ta_2O_3$, vanadium dioxide ($VO_2$), aluminate ($AlO_2$), silicon dioxide ($SiO_2$), strontium titanate ($SrTiO_3$), barium titanate ($BaTiO_3$), bismuth ferrite ($BiFeO_3$) or a combination thereof, but is not limited thereto.

In some embodiments, the dielectric layer 160 may include a multi-layer in which a plurality of material layers including different materials from each other are stacked. For example, the dielectric layer 160 may include a first dielectric layer (not shown), which is in contact with the lower electrode LE, and a second dielectric layer (not shown) on the first dielectric layer.

The first dielectric layer may include a ferroelectric material layer, an antiferroelectric material layer, or a combination thereof. In embodiments, the first dielectric layer may include a single layer in which a ferroelectric material and an antiferroelectric material are non-uniformly mixed. In other embodiments, the first dielectric layer may include a single layer including a ferroelectric material. In other embodiments, the first dielectric layer may include a single layer including an antiferroelectric material. The second dielectric layer may include a paraelectric material layer.

For example, the first dielectric layer may include $HfZrO_2$, $ZrO_2$, $PbTiO_3$, $AgNbO_3$, or a combination thereof. The second dielectric layer may include $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof.

In some embodiments, a thickness of the dielectric layer 160 may be greater than about 0 nm and less than about 6 nm. In some embodiments, each of a thickness of the first dielectric layer and a thickness of the second dielectric layer may be greater than about 0 nm and less than about 3 nm. In other embodiments, each of a thickness of the first dielectric layer and a thickness of the second dielectric layer may be about 3 nm to about 6 nm, but is not limited thereto.

The first upper electrode UE1A may be disposed on the lower electrode LE and the dielectric layer 160. The lower electrode LE may be disposed within the first area CR1 of the substrate 110, whereas the first upper electrode UE1A may be disposed within the first area CR1 and the second area CR2 of the substrate 110. For example, the first upper electrode UE1A may be formed to cover the dielectric layer 160 of the first area CR1 and the second area CR2. The first upper electrode UE1A may include one or more materials selected from among SiGe and silicon (Si).

In some embodiments, the first upper electrode UE1A may include a first portion UE1_1 within the first area CR1 of the substrate 110 and a second portion UE1_2A within the second area CR2 of the substrate 110. For example, the first upper electrode UE1A may include the first portion UE1_1 which fills between the lower electrode LE and the supporters 142P and 144P within the first area CR1 of the substrate 110 and is disposed on the dielectric layer 160. For example, the first upper electrode UE1A may include the second portion UE1_2A extending in the horizontal direction (Z direction) within the second area CR2 of the substrate 110. In a plan view, the second portion UE1_2A of the first upper electrode UE1A may have a shape that horizontally surrounds a remaining portion of the capacitor CP. In other words, the second portion UE1_2A of the first upper electrode UE1A may horizontally surround the lower electrode LE disposed within the first area CR1 of the substrate 110, the upper supporter 144P, the lower supporter 142P, the first portion UE1_1 of the first upper electrode UE1A, and the dielectric layer 160 arranged between the lower electrode LE and the first portion UE1_1 of the first upper electrode UE1A.

In some embodiments, the second portion UE1_2A of the first upper electrode UE1A may include a portion of the first upper electrode UE1A adjacent to the connection area BR. In other words, the second portion UE1_2A of the first upper electrode UE1A may include a portion arranged at a boundary between the cell area CR and the connection area BR. The second portion UE1_2A of the first upper electrode UE1A may include a portion arranged between the lower electrode LE of the first area CR1 and the connection area BR.

In some embodiments, the first portion UE1_1 of the first upper electrode UE1A may include a portion arranged between the plurality of lower electrodes LE. On the other hand, the second portion UE1_2A of the first upper electrode UE1A may include a portion disposed on a sidewall of an outermost lower electrode LE from among the plurality of lower electrodes LE.

In some embodiments, an upper surface UE1_1*t* of the first portion UE1_1 of the first upper electrode UE1A may be located at the same vertical level at which an upper surface UE1_2At of the second portion UE1_2A of the first upper electrode UE1A is located. In other embodiments, unlike shown in FIG. 4, the upper surface UE1_1*t* of the first portion UE1_1 of the first upper electrode UE1A may be located at a vertical level different from a vertical level of the upper surface UE1_2At of the second portion UE1_2A of the first upper electrode UE1A.

The second upper electrode UE2 may be disposed on the first upper electrode UE1A. For example, the second upper electrode UE2 may be disposed on the first portion UE1_1 of the first upper electrode UE1A. In other words, the second upper electrode UE2 may be disposed above the substrate 110 within the first area CR1. For example, the second upper electrode UE2 may not be disposed on the second portion UE1_2A of the first upper electrode UE1A. In other words, the second upper electrode UE2 may not be disposed above the substrate 110 within the second area CR2. In some embodiments, the second upper electrode UE2 may have a plate shape extending in a first horizontal direction (X direction) and a second horizontal direction (Y direction), but a shape of the second upper electrode UE2 is not limited thereto. The second upper electrode UE2 may include one or more materials selected from among W, TiN, and a combination thereof.

In some embodiments, as described above, the second upper electrode UE2 including one or more materials selected from among W, TiN, and a combination thereof may not be disposed within the second area CR2 of the substrate 110. In other words, within the second area CR2, W, TiN, and a combination thereof may not be disposed. In other words, the second portion UE1_2A of the first upper electrode UE1A disposed within the second area CR2 may not include W, TiN, and a combination thereof.

A protective layer 170 including an insulating material may be disposed on the second upper electrode UE2. For example, the protective layer 170 may be disposed on the second upper electrode UE2 disposed within the first area CR1 of the substrate 110. The protective layer 170 may include one or more materials selected from among a silicon oxide, a silicon nitride, and a silicon oxynitride. The protective layer 170 may include a plurality of layers. Each of the plurality of layers of the protective layer 170 may include one or more materials selected from among a silicon oxide, a silicon nitride, and a silicon oxynitride.

In some embodiments, due to the capacitor CP arranged in the cell area CR of the semiconductor device 100A, a step may be formed between the cell area CR and the connection area BR. For example, due to the lower electrode LE disposed within the first area CR1 of the substrate 110, a step may be formed between the cell area CR and the connection area BR, and the first upper electrode UE1A filling between the lower electrodes LE and covering the lower electrodes LE may include the second portion UE1_2A extending in the vertical direction (Z direction) in the second area CR2 between the first area CR1 and the connection area BR.

An insulating layer 180A, a first insulating liner 181, and a second insulating liner 182 may be provided on the connection area BR of the substrate 110. Each of the insulating layer 180A, the first insulating liner 181, and the second insulating liner 182 may include one or more materials selected from among a silicon oxide, a silicon nitride, and a silicon oxynitride.

For example, the insulating layer 180A filling a step formed due to the capacitor CP arranged in the cell area CR may be formed. For example, the insulating layer 180A may be formed on the connection area BR by horizontally surrounding the capacitor CP. The insulating layer 180A may be formed to be in contact with a side surface of the second portion UE1_2A of the first upper electrode UE1A. An upper surface of the insulating layer 180A may be located at the same vertical level at which the upper surface UE1_2At of the second portion UE1_2A of the first upper electrode UE1A is located.

For example, the first insulating liner 181 surrounding the second upper electrode UE2 of the cell area CR may be formed. For example, the second upper electrode UE2 may be formed in the first area CR1 of the cell area CR, and the first insulating liner 181 surrounding the second upper electrode UE2 may be formed in the second area CR2 and the connection area BR. The upper surface of the first insulating liner 181 may be located at the same vertical level at which an upper surface of the second upper electrode UE2 is located.

For example, the second insulating liner 182 surrounding the protective layer 170 of the cell area CR may be formed. For example, the protective layer 170 may be formed in the first area CR1 of the cell area CR, and the second insulating liner 182 surrounding the protective layer 170 may be formed in the second area CR2 and the connection area BR. An upper surface of the second insulating liner 182 may be located at the same vertical level at which an upper surface of the protective layer 170 is located. In some embodiments, the protective layer 170 and the second insulating liner 182 surrounding the same may all include an insulating material, but may include different materials from each other or may be separated from each other due to a difference in processing order. In some embodiments, the protective layer 170 and the second insulating liner 182 surrounding the same may denote an insulating layer covering the second upper electrode UE2 and the first insulating liner 181 surrounding the second upper electrode UE2, and a portion disposed within the first area CR1 may be referred to as the protective layer 170, and a portion disposed within the second area CR2 may be referred to as the second insulating liner 182.

By the semiconductor device 100A according to embodiments according to the inventive concept, the second upper electrode UE2 disposed only on the first portion UE1_1 of the first upper electrode UE1 within the first area CR1 may be provided. In the semiconductor device 100A, because the second upper electrode UE2 is disposed only on the first portion UE1_1 of the first area CR1 and is not disposed on the second portion UE1_2A of the second area CR2, a horizontal thickness of the capacitor CP portion disposed within the second area CR2 may be reduced. In other words, a size, in the horizontal direction, of the cell area CR of the semiconductor device 100A may be reduced, and accordingly, a size of the semiconductor device 100A in the horizontal direction may be reduced.

By the semiconductor device 100A according to embodiments according to the inventive concept, process difficulty may be reduced. For example, in the semiconductor device 100A, because the second upper electrode UE2 is disposed only within the first area CR1, a thickness, in the horizontal direction, of the capacitor CP portion disposed within the second area CR2 may be reduced, and thus, process defects that may occur due to a large thickness may be improved. Accordingly, the semiconductor 100A with improved reliability may be provided.

By the semiconductor device 100A according to embodiments according to the inventive concept, the second upper electrode UE2 disposed only on the first portion UE1_1 of the first upper electrode UE1 within the first area CR1 and the protective layer 170 disposed only on the second upper electrode UE2 may be provided. In the semiconductor device 100A, because the protective layer 170 is disposed only within the first area CR1, the protective layer 170 may be formed without additionally increasing the size of the cell area CR of the semiconductor device 100A in the horizontal direction.

Figure 5:
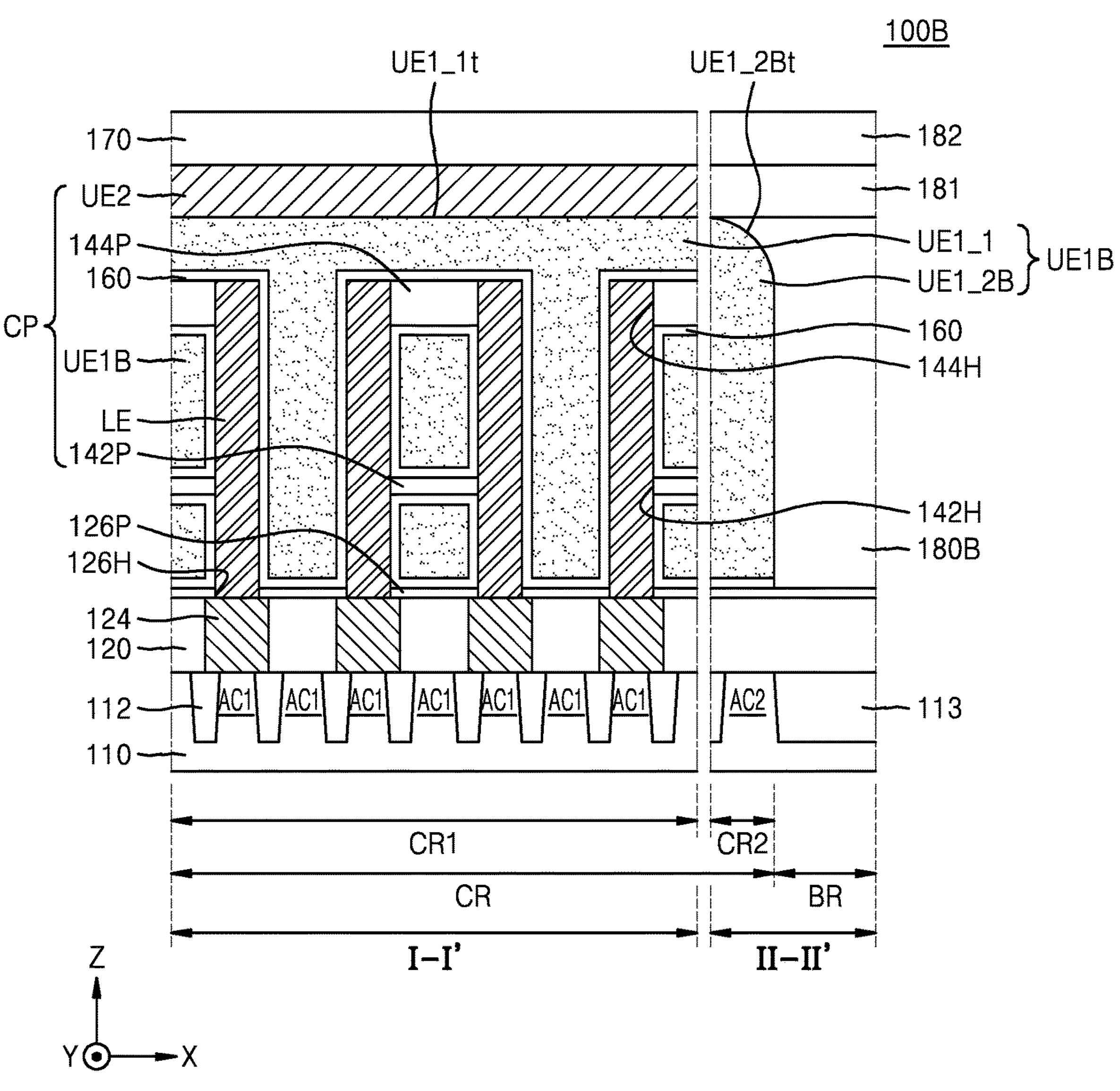

Referring to FIG. 5, a semiconductor device 100B may be provided. Differences from the semiconductor device 100A described with reference to FIG. 4 are mainly described below.

The semiconductor device 100B may include a first upper electrode UE1B including a second portion UE1_2B. The second portion UE1_2B may include a bent side surface. For example, an upper surface UE1_2Bt of the second portion UE1_2B of the first upper electrode UE1B may include a portion at a vertical level different from a vertical level of the upper surface UE1_1*t* of the first portion UE1_1. In other words, the upper surface UE1_2Bt of the second portion UE1_2B of the first upper electrode UE1B may include a portion of which the vertical level decreases as a distance from the connection area BR decreases, within the second area CR2.

For example, a thickness of the second portion UE1_2B of the first upper electrode UE1B in the first horizontal direction (X direction) may not be constant in the vertical direction (Z direction). For example, the second portion UE1_2B of the first upper electrode UE1B may include a portion of which the thickness in the first horizontal direction (X direction) decreases as a distance from the substrate 110 in the vertical direction (Z direction) increases.

In some embodiments, an insulating layer 180B may be formed by surrounding the second portion UE1_2B of the first upper electrode UE1B within the connection area BR and may fill a portion not filled in the second area CR2 by the second portion UE1_2B. In other words, the insulating layer 180B may include a portion disposed on an upper surface of the second portion UE1_2B. In other words, the insulating layer 180B may include a portion formed within the second area CR2. The insulating layer 180B may include a bent side surface along a side surface of the second portion UE1_2B.

Figure 6:
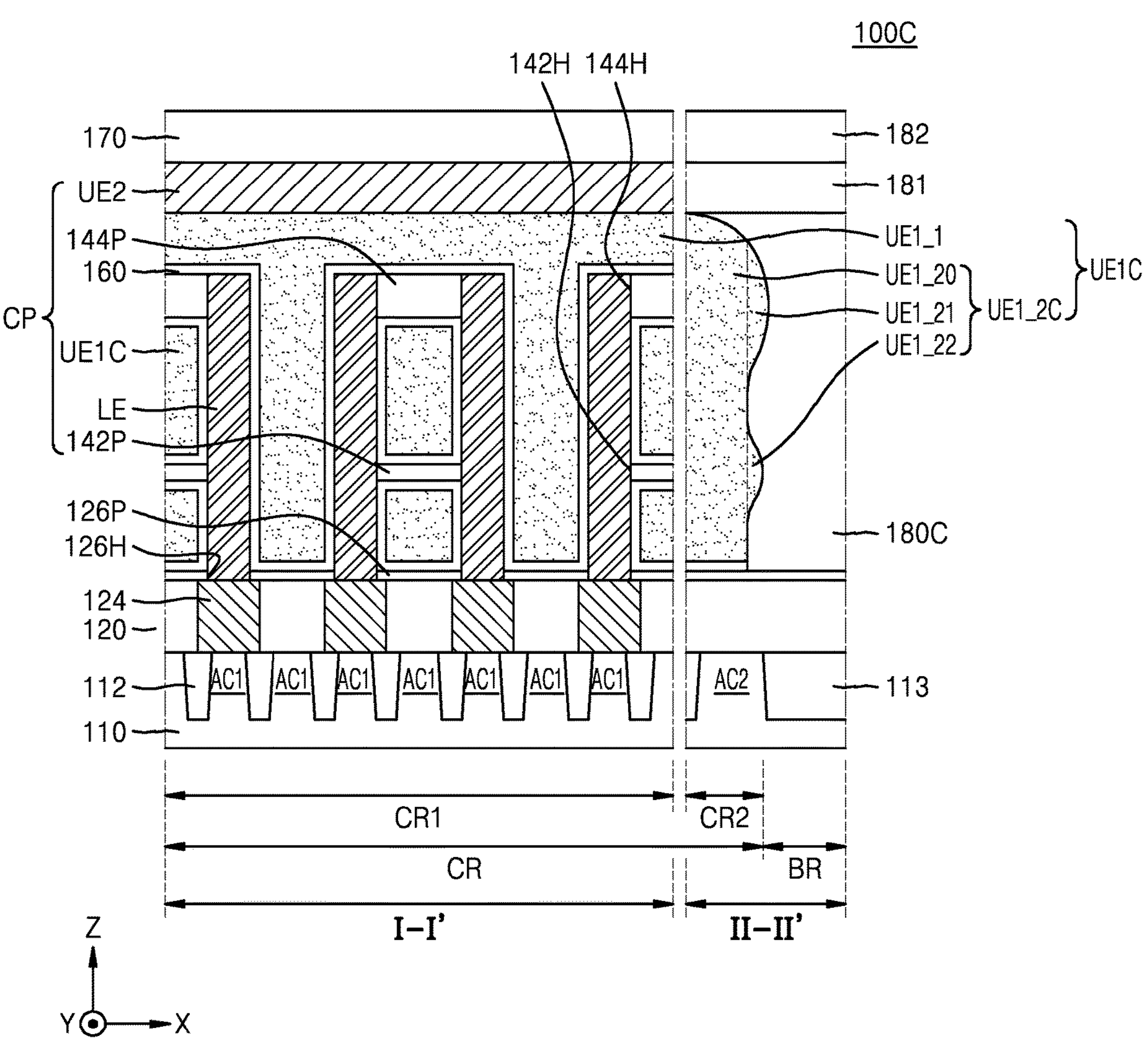

Referring to FIG. 6, a semiconductor device 100C may be provided. Differences from the semiconductor device 100A described with reference to FIG. 4 are mainly described below.

The semiconductor device 100C may include a first upper electrode UE1C including a second portion UE1_2C. The second portion UE1_2C may include a bent side surface. For example, an upper surface of the second portion UE1_2C of the first upper electrode UE1C may include a portion at a vertical level different from a vertical level of an upper surface of a first portion UE1_1. In other words, an upper surface of the second portion UE1_2C of the first upper electrode UE1C may include a portion of which the vertical level decreases as a distance from the connection area BR decreases, within the second area CR2.

The second portion UE1_2C of the first upper electrode UE1C may further include at least one protrusion UE1_21 and UE1_22. For example, the second portion UE1_2C may further include the at least one protrusion UE1_21 and UE1_22 protruding toward the connection area BR in the second area CR2. For example, the second portion UE1_2C may further include the at least one protrusion UE1_21 and UE1_22 protruding in the first horizontal direction (X direction). The at least one protrusion UE1_21 and UE1_22 may also protrude in the second horizontal direction (Y direction).

At least part of the at least one protrusion UE1_21 and UE1_22 may overlap the supporters 144P and 142P in the first horizontal direction (X direction). For example, the at least part of the first protrusion UE1_21 may overlap the upper supporter 144P in the first horizontal direction (X direction). In other words, the at least part of the first protrusion UE1_21 may be at the same vertical level at which the upper supporter 144P is located. For example, at least part of the second protrusion UE1_22 may overlap the lower supporter 142P in the first horizontal direction (X direction). In other words, the at least part of the second protrusion UE1_22 may be at the same vertical level at which the lower supporter 142P is located. When the at least one protrusion UE1_21 and UE1_22 protrudes in the second horizontal direction (Y direction), at least part of the at least one protrusion UE1_21 and UE1_22 may overlap the supporters 144P in the second horizontal direction (Y direction).

In some embodiments, the first protrusion UE1_21 and the second protrusion UE1_22 may not overlap each other in a horizontal direction. In some other embodiments, the first protrusion UE1_21 and the second protrusion UE1_22 may include portions that overlap each other in a horizontal direction.

In some embodiments, an insulating layer 180C may be formed by surrounding the second portion UE1_2C of the first upper electrode UE1C within the connection area BR and may fill a portion not filled in the second area CR2 by the second portion UE1_2C. In other words, the insulating layer 180C may be formed on the upper surface of the second portion UE1_2C and on the connection area BR filling between the first protrusion UE1_21 and the second protrusion UE1_22. In other words, the insulating layer 180C may include a portion disposed within the second area CR2. The insulating layer 180C may have a bent side surface along a side surface of the second portion UE1_2C.

Figure 7:
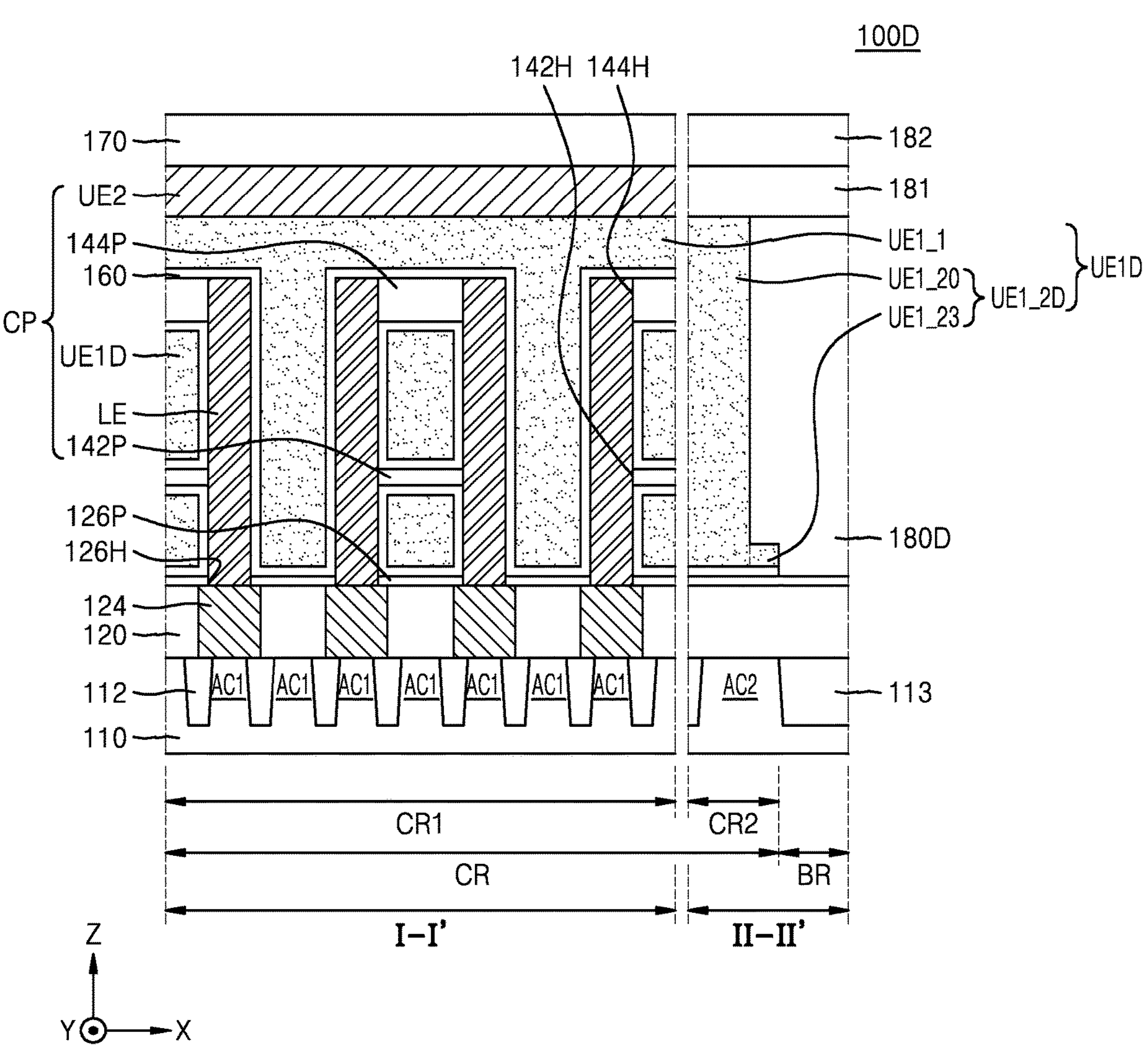

Referring to FIG. 7, a semiconductor device 100D may be provided. Differences from the semiconductor device 100A described with reference to FIG. 4 are mainly described below.

The semiconductor device 100D may include a first upper electrode UE1D including a second portion UE1_2D. The second portion UE1_2D may further include a tail portion UE1_23 protruding toward the connection area BR within the second area CR2. For example, the second portion UE1_2D may further include the tail portion UE1_23 protruding in the first horizontal direction (X direction) within the second area CR2. In other words, the second portion UE1_2D of the first upper electrode UE1D may have an L-shaped cross-section. The tail portion UE1_23 may also protrude in the second horizontal direction (Y direction). The tail portion UE1_23 may include a portion in which a lower portion of the second portion UE1_2D protrudes toward the connection area BR within the second area CR2. In other words, a lower surface of the tail portion UE1_23 may be at the same vertical level at which a lower surface of the second portion UE1_2D is located. The tail portion UE1_23 may include a portion disposed on the dielectric layer 160 of the second area CR2. In other words, the lower surface of the tail portion UE1_23 may be at the same vertical level at which an upper surface of the dielectric layer 160 of the second area CR2 is located.

The tail portion UE1_23 may not overlap the supporters 144P and 142P in the first horizontal direction (X direction). In other words, the tail portion UE1_23 may be at a vertical level different from vertical levels of the supporters 144P and 142P.

In some embodiments, an insulating layer 180D may be formed by surrounding the second portion UE1_2D of the first upper electrode UE1D within the connection area BR and may fill a portion not filled in the second area CR2 by the second portion UE1_2D. In other words, because the tail portion UE1_23 of the second portion UE1_2D protrudes toward the connection area BR, the insulating layer 180D may be formed within the second area CR2 by filling the upper portion above the tail portion UE1_23. In other words, the insulating layer 180D may include a portion disposed within the second area CR2. The insulating layer 180D may have a bent side surface along a side surface of the second portion UE1_2D.

Figure 8:
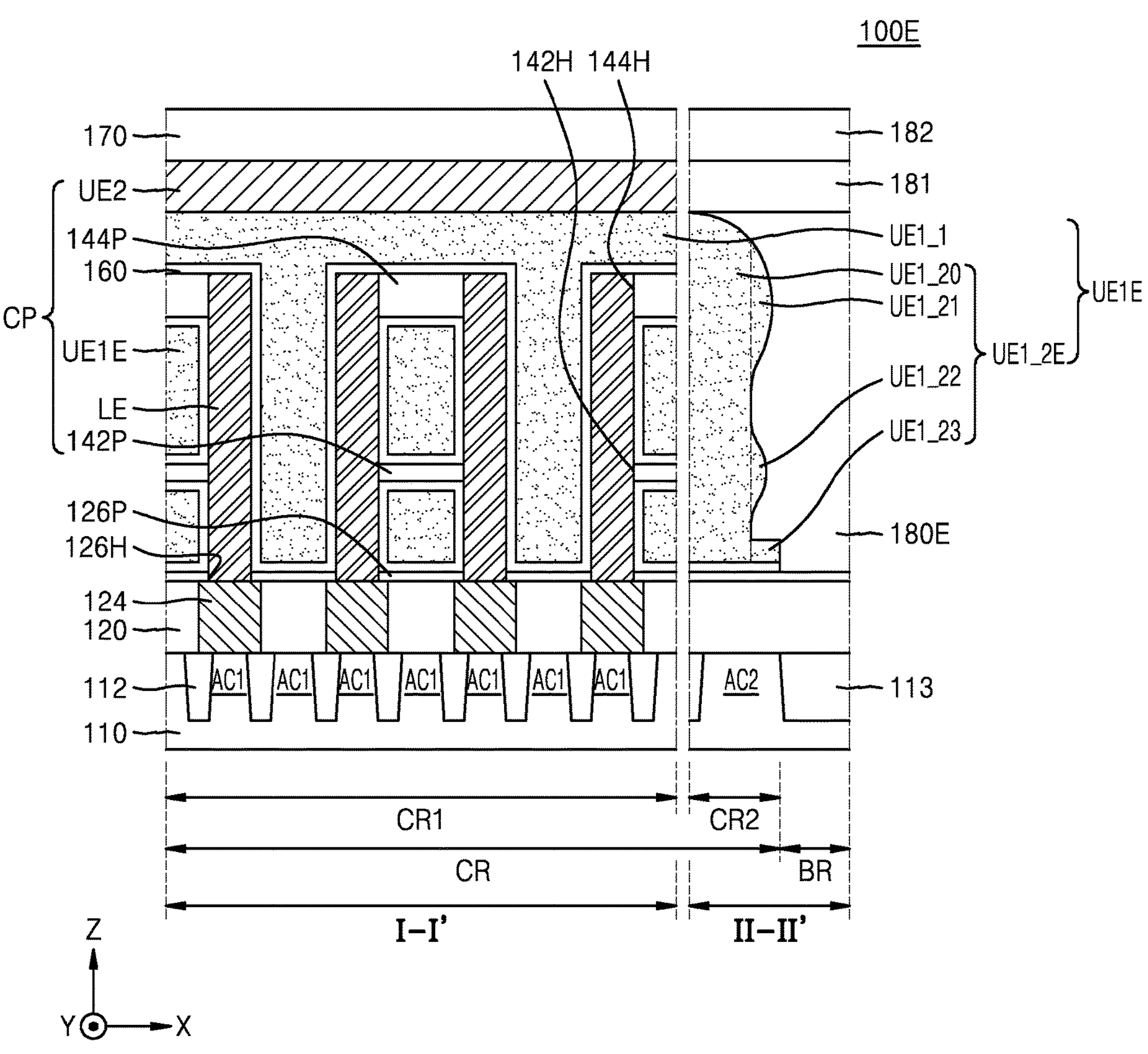

Referring to FIG. 8, a semiconductor device 100E may be provided. Differences from the semiconductor device 100A described with reference to FIG. 4 are mainly described below.

The semiconductor device 100E may include a first upper electrode UE1E including a second portion UE1_2E. The second portion UE1_2E may include a bent side surface.

For example, an upper surface of the second portion UE1_2E of the first upper electrode UE1E may include a portion at a vertical level different from a vertical level of the upper surface of the first portion UE1_1. In other words, the upper surface of the second portion UE1_2E of the first upper electrode UE1E may include a portion of which the vertical level decreases as a distance from the connection area BR decreases within the second area CR2.

The second portion UE1_2E of the first upper electrode UE1E of the semiconductor device 100E may further include at least one protrusion UE1_21 and UE1_22. For example, the second portion UE1_2E may further include the at least one protrusion UE1_21 and UE1_22 toward the connection area BR in the second area CR2. The at least one protrusion UE1_21 and UE1_22 of the second portion UE1_2E is similar to those described with reference to FIG. 6.

The second portion UE1_2E of the first upper electrode UE1E of the semiconductor device 100E may further include a tail portion UE1_23 protruding toward the connection area BR within the second area CR2. For example, the second portion UE1_2E may further include the tail portion UE1_23 protruding in the first horizontal direction (X direction) within the second area CR2. The tail portion UE1_23 of the second portion UE1_2E is similar to that described with reference to FIG. 7.

In some embodiments, when the semiconductor device 100E includes both the at least one protrusion UE1_21 and UE1_22 and the tail portion UE1_23, vertical levels of the at least one protrusion UE1_21 and UE1_22 and the tail portion UE1_23 may be different from each other. For example, the at least one protrusion UE1_21 and UE1_22 includes at least a portion overlapping the supporters 144P and the 142P in the first horizontal direction (X direction), whereas the tail portion UE1_23 may not overlap the supporters 144P and 142P in the first horizontal direction (X direction). For example, the tail portion UE1_23 may be disposed on the dielectric layer 160 of the second area CR2, and may include a lower surface at the same vertical level at which a lower surface of the second portion UE1_2E is located. On the other hand, the at least one protrusion UE1_21 and UE1_22 is at higher vertical levels than a vertical level of the lower surface of the second portion UE1_2E.

In some embodiments, the insulating layer 180E is formed by surrounding the second portion UE1_2E of the first upper electrode UE1E within the connection area BR and may fill a portion not filled in the second area CR2 by the second portion UE1_2E. In other words, the insulating layer 180E may include a portion disposed on the upper surface of the second portion UE1_2E. In other words, as each of the at least one protrusion UE1_21 and UE1_22 and the tail portion UE1_23 of the second portion UE1_2E protrude toward the connection area BR, the insulating layer 180E may be formed within the second area CR2 by filling between the at least one protrusion UE1_21 and UE1_22 and between each of the at least one protrusion UE1_21 and UE1_22 and the tail portion UE1_23. In other words, the insulating layer 180E may include a portion disposed within the second area CR2. The insulating layer 180E may have a bent side surface along a side surface of the second portion UE1_2E.

By the semiconductor device 100E according to embodiments according to the inventive concept, the second upper electrode UE2 is disposed only on the first portion UE1_1 of the first area CR1 and is not disposed on the second portion UE1_2E of the second area CR2, and thus, a thickness, in a horizontal direction, of the capacitor portion CP disposed within the second area CR2 may be reduced. For example, lengths, in a horizontal direction, of protrusions and a tail portion of the capacitor CP disposed within the second area CR2 may be reduced.

Figure 9:
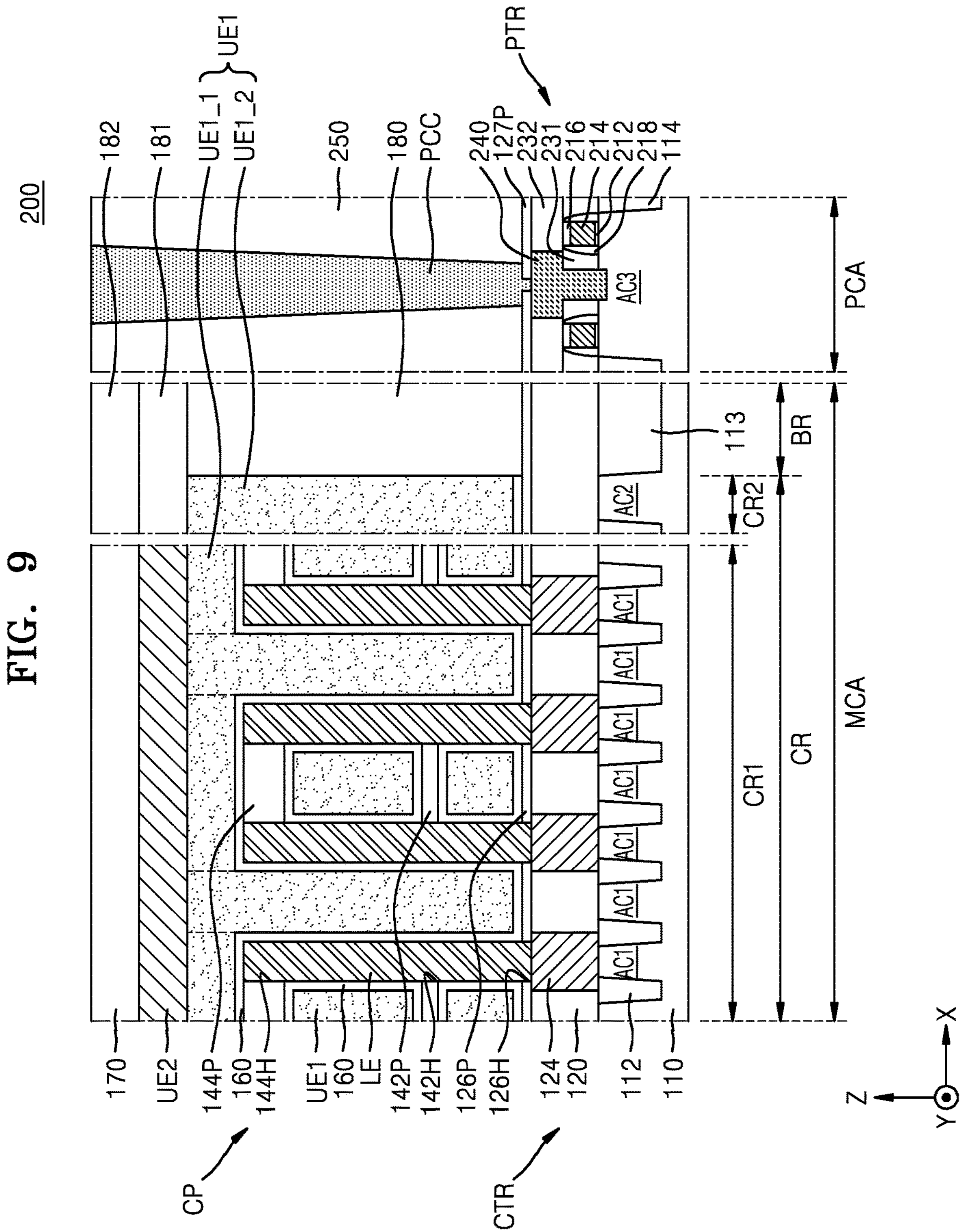
FIG. 9 is a cross-sectional view schematically illustrating a partial configuration of a semiconductor device according to embodiments of the inventive concept.

FIG. 9 is a cross-sectional view schematically illustrating a partial configuration of a semiconductor device 200 according to embodiments of the inventive concept.

The semiconductor device 200 may include the substrate 110 including the cell array area MCA and the peripheral circuit area PCA. The cell array area MCA and the peripheral circuit area PCA may be similar to those described with reference to FIG. 1, respectively. The cell array area MCA may include the cell area CR including the first area CR1 and the second area CR2, and the connection area BR surrounding the cell area CR. The first area CR1, the second area CR2, and the connection area BR may be similar to those described with reference to FIGS. 2 and 4, respectively.

The semiconductor device 200 may include a cell transistor CTR disposed within the cell array area MCA of the substrate 110, a capacitor CP electrically connected thereto, a peripheral circuit transistor PTR disposed within the peripheral circuit area PCA of the substrate 110, and a peripheral circuit contact PCC electrically connected thereto. The cell transistor CTR and the capacitor CP may be similar to the cell transistor CTR and the capacitor CP described with reference to FIGS. 2 to 4, respectively.

In some embodiments, a peripheral circuit isolation layer 114 and a third active area AC3 defined thereby may be arranged within the substrate 110 of the peripheral circuit area PCA. The peripheral circuit isolation layer 114 may include an oxide layer, a nitride layer, or a combination thereof. In some embodiments, the peripheral circuit isolation layer 114 may have various structures, such as an STI structure.

In some embodiments, the peripheral circuit transistor PTR may be disposed within the third active area AC3 of the peripheral circuit area PCA. The peripheral circuit transistor PTR may include a gate dielectric layer 212, a peripheral circuit gate electrode 214, and a gate capping pattern 216, which are sequentially stacked within the third active area AC3.

In some embodiments, the gate dielectric layer 212 may include at least one layer selected from among a silicon oxide layer, a silicon nitride layer, a silicon oxynitride layer, an oxide/nitride/oxide (ONO) layer, and a high dielectric layer having a higher dielectric constant than the silicon oxide layer. The peripheral circuit gate electrode 214 may include the same material as the bit line BL arranged in the cell array area MCA described with reference to FIG. 3. The peripheral circuit gate electrode 214 may have a structure including a lower conductive pattern (not shown), an intermediate conductive pattern (not shown), and an upper conductive pattern (not shown). The lower conductive pattern (not shown) may include doped polysilicon. Each of the intermediate conductive pattern (not shown) and the upper conductive pattern (not shown) may include TiN, titanium silicon nitride (TiSiN), W, tungsten silicide, or a combination thereof. The gate capping pattern 216 may include a silicon nitride layer.

In some embodiments, both sidewalls of each of the peripheral circuit gate electrode 214 and the gate capping pattern 216 may be covered by an insulating spacer 218. The insulating spacer 218 may include an oxide layer, a nitride layer, or a combination thereof. Although not shown, the peripheral circuit transistor PTR and the insulating spacer 218 may covered by a peripheral circuit protective layer (not shown), and a first interlayer insulating layer 231 may be disposed on the peripheral circuit protective layer and fill a space between two adjacent peripheral circuit transistors PTR. The interlayer insulating layer 231 may have an upper surface at the same vertical level at which an upper surface of the gate capping pattern 216 is located. A second interlayer insulating layer 232 may be disposed on the first interlayer insulating layer 231 and the peripheral circuit transistor PTR.

In the peripheral circuit area PCA, a contact plug 240 vertically passing through the first interlayer insulating layer 231 and the second interlayer insulating layer 232 may be formed. A metal silicide layer (not shown) may be between the third active area AC3 and the contact plug 240.

A second insulating pattern 127P covering the contact plug 240 may be disposed on the second interlayer insulating layer 232. The second insulating pattern 127P may be at the same vertical level at which a first insulating pattern 126P arranged in the cell array area MCA is located.

In the peripheral circuit area PCA, the peripheral circuit contact PCC extending in the vertical direction (Z direction) through an interlayer insulating layer 250 and the second insulating pattern 127P may be arranged. The peripheral circuit contact PCC may be electrically connected to the peripheral circuit transistor PTR through the contact plug 240. Although not shown, the peripheral circuit contact PCC may include a conductive barrier layer and a contact conductive layer formed on the conductive barrier layer.

According to embodiments of the inventive concept, the semiconductor device 200 in which a distance between the capacitor CP disposed within the cell array area MCA and the peripheral circuit contact PCC disposed within the peripheral circuit area PCA is reduced. For example, in the semiconductor device 200, as the second upper electrode UE2 is disposed only within the first area CR1, a thickness, in a horizontal direction, of the capacitor CP portion disposed within the second area CR2 may be reduced, and thus, the semiconductor device 200 in which a distance between the lower electrode LE disposed within the first area CR1 and the peripheral circuit contact PCC disposed within the peripheral circuit area PCA is reduced may be provided.

FIGS. 10A to 10K are cross-sectional views for describing a manufacturing method for a semiconductor device, according to embodiments of the inventive concept.

Figure 10A:
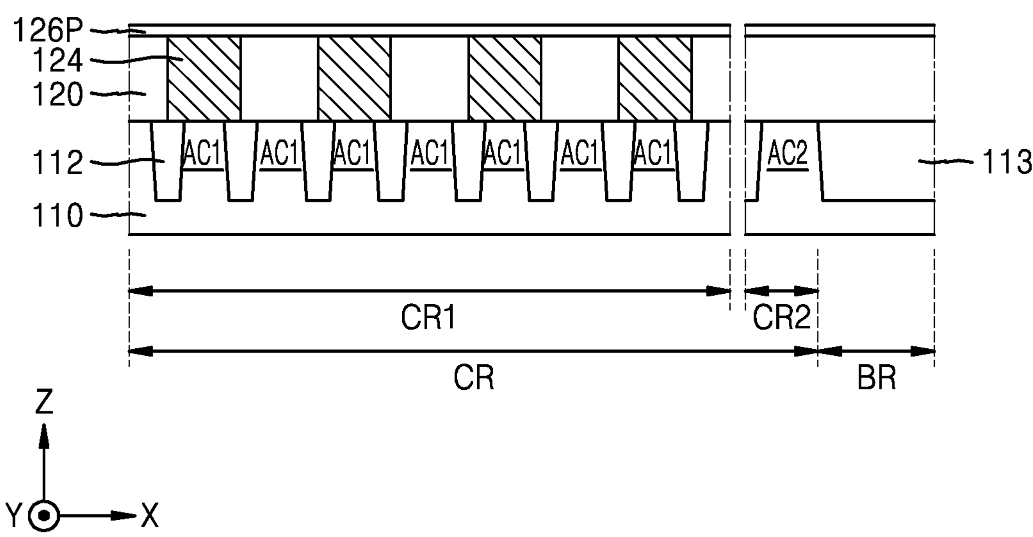
FIGS. 10A to 10K are cross-sectional views for describing a manufacturing method for a semiconductor device, according to embodiments of the inventive concept.

Referring to FIG. 10A, an element isolation layer 112 may be provided within the cell area CR of the substrate 110 to define a plurality of active areas AC1 and AC2, and a connection isolation layer 113 may be provided within the connection area BR. A lower structure 120 and a conductive pattern 124 connected to the active area AC through the lower structure 120 may be formed on the substrate 110 of the cell area CR. Thereafter, an insulating layer 126 covering the lower structure 120 and the conductive pattern 124 may be formed in the cell area CR and the connection area BR.

The insulating layer 126 may be used as an etching stop layer in a subsequent process. The insulating layer 126 may include an insulating material having an etching selectivity with respect to the lower structure 120. In some embodiments, the insulating layer 126 may include a SiN layer, a SiCN layer, a SiBN layer, or a combination thereof.

Figure 10B:
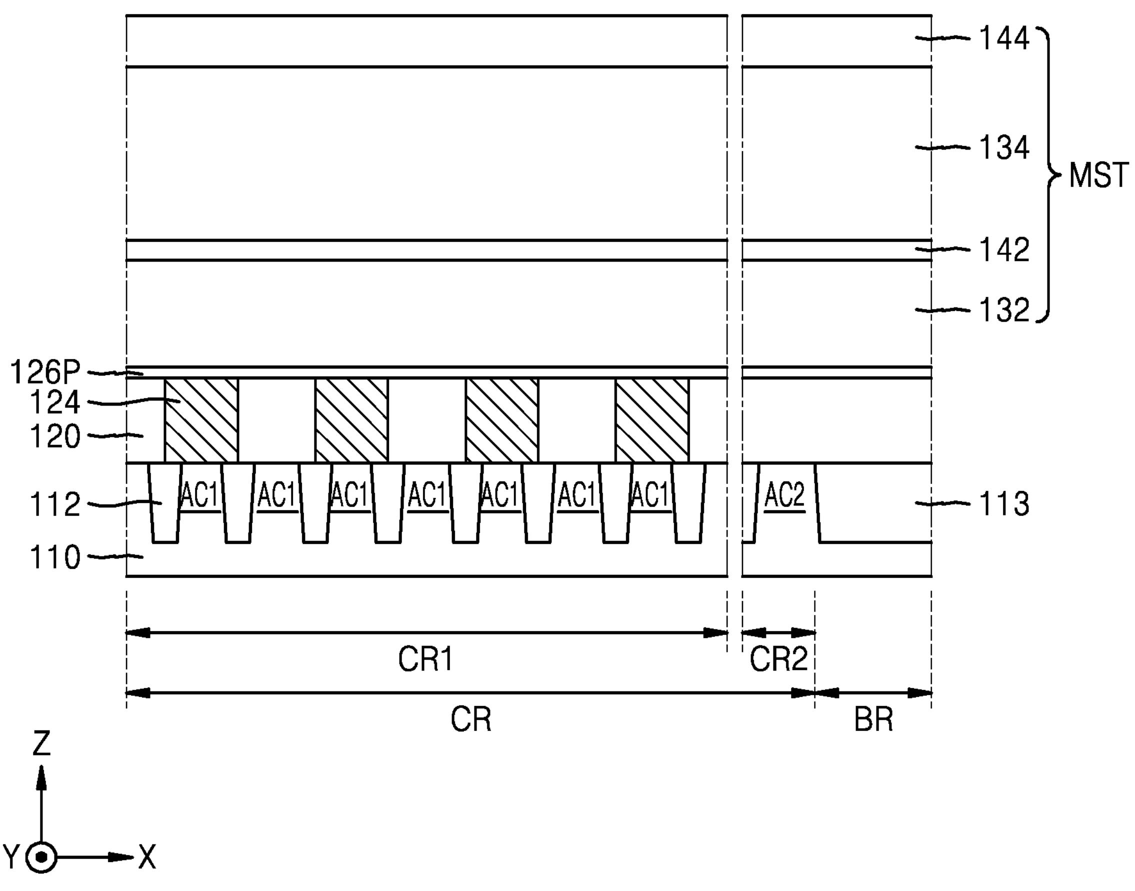

Referring to FIG. 10B, a mold structure MST may be formed on the insulating layer 126. For example, the mold structure MST may be formed on the insulating layer 126 of the cell area CR and the connection area BR. For example, the mold structure MST may be formed on a plurality of first active areas AC1 of the first area CR1 and a plurality of second active areas AC2 of the second area CR2. For example, the mold structure MST may be formed on the element isolation layer 112 of the cell area CR and the connection isolation layer 113 of the connection area BR.

The mold structure MST may include a plurality of mold layers and a plurality of support layers. For example, the mold structure MST may include a first mold layer 132, a lower supporter layer 142, a second mold layer 134, and an upper supporter layer 144, which are sequentially stacked on the insulating layer 126. Because each of the first mold layer 132 and the second mold layer 134 has a high etching rate compared to an etchant containing ammonium fluoride ($NH_4F$), hydrogen fluoride (HF), and water, and thus may include a material that may be removed by a lift-off process using the etchant. In some embodiments, each of the first mold layer 132 and the second mold layer 134 may include an oxide layer, a nitride layer, or a combination thereof. For example, the first mold layer 132 may include a boro phosphor silicate glass (BPSG) layer. The BPSG layer may include at least one of a first portion in which a concentration of dopant boron (B) varies in a thickness direction of the BPSG layer, and a second portion in which a concentration of dopant phosphorus (P) varies in the thickness direction of the BPSG layer. The second mold layer 134 may include a multi-insulating layer, in which a silicon oxide layer and a silicon nitride layer, which are each relatively thin, are alternately stacked a plurality of times, or a silicon nitride layer. However, a material of each of the first mold layer 132 and the second mold layer 134 is not limited to those described above, and may be variously modified within the scope of the inventive concept. In addition, a stack order of the mold structure MST is not limited to that described with reference to FIG. 10B, and may be variously modified within the scope of the inventive concept.

Each of the lower supporter layer 142 and the upper supporter layer 144 may include a SiN layer, a SiCN layer, a SiBN layer, or a combination thereof. In embodiments, the lower supporter layer 142 and the upper supporter layer 144 may include the same material as each other. In other embodiments, the lower supporter layer 142 and the upper supporter layer 144 may include different materials from each other. For example, each of the lower supporter layer 142 and the upper supporter layer 144 may include a SiCN layer. In another example, the lower supporter layer 142 may include a SiCN layer, and the upper supporter layer 144 may include a SiN layer containing boron. However, materials of the lower supporter layer 142 and the upper supporter layer 144 are not limited to those described above, and may be variously modified within the scope of the inventive concept.

Figure 10C:
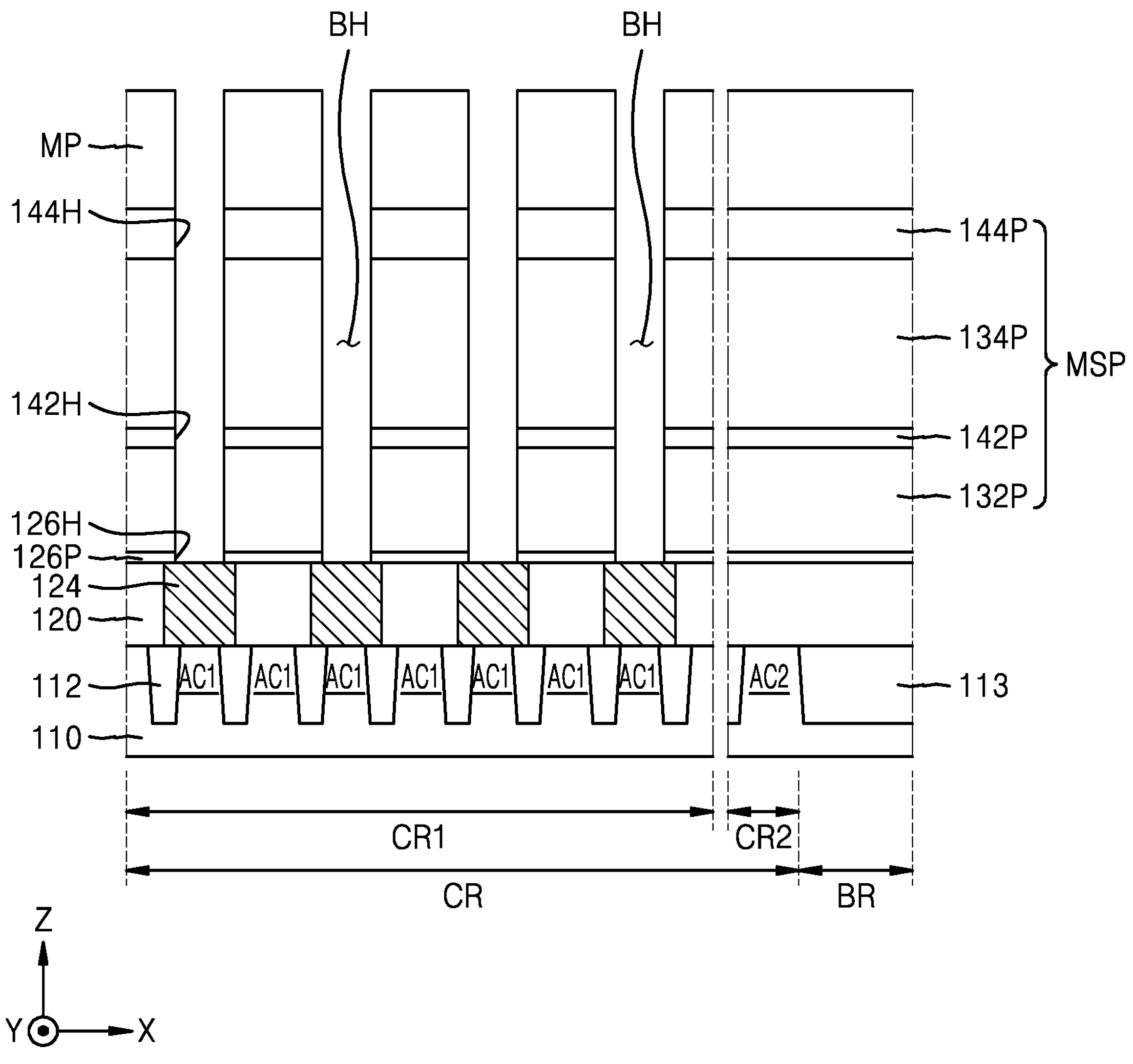

Referring to FIG. 10C, in the result of FIG. 10B, a mold structure pattern MSP defining a plurality of holes BH may be formed by forming a mask pattern MP on the mold structure MST and then anisotropically etching the mold structure MST and using the mask pattern MP as an etching mask and using the insulating layer 126 as an etching stop layer. The mold structure pattern MSP may include a first mold pattern 132P, a lower supporter 142P, a second mold pattern 134P, and an upper supporter 244P.

The mask pattern MP may include a nitride layer, an oxide layer, a polysilicon layer, a photoresist layer, or a combination thereof.

A process of forming the plurality of holes BH may further include a process of wet-processing a result of anisotropically etching the mold structure MST. While a process of anisotropically etching the mold structure MST and wet-processing a result thereof, part of the insulating layer 126 is etched together, and a first insulating pattern 126P having a plurality of openings 126H exposing the plurality of conductive patterns 124 may be obtained. In an example of a process for wet-processing the result of anisotropically etching the mold structure MST, an etchant including a diluted sulfuric acid peroxide (DSP) solution may be used, but is not limited thereto.

In the mold structure pattern MSP, a plurality of holes 142H, which are part of the plurality of holes BH, may be formed in the lower supporter 142P, and a plurality of holes 144H, which are part of the plurality of holes BH, may be formed in the upper supporter 144P.

Figure 10D:
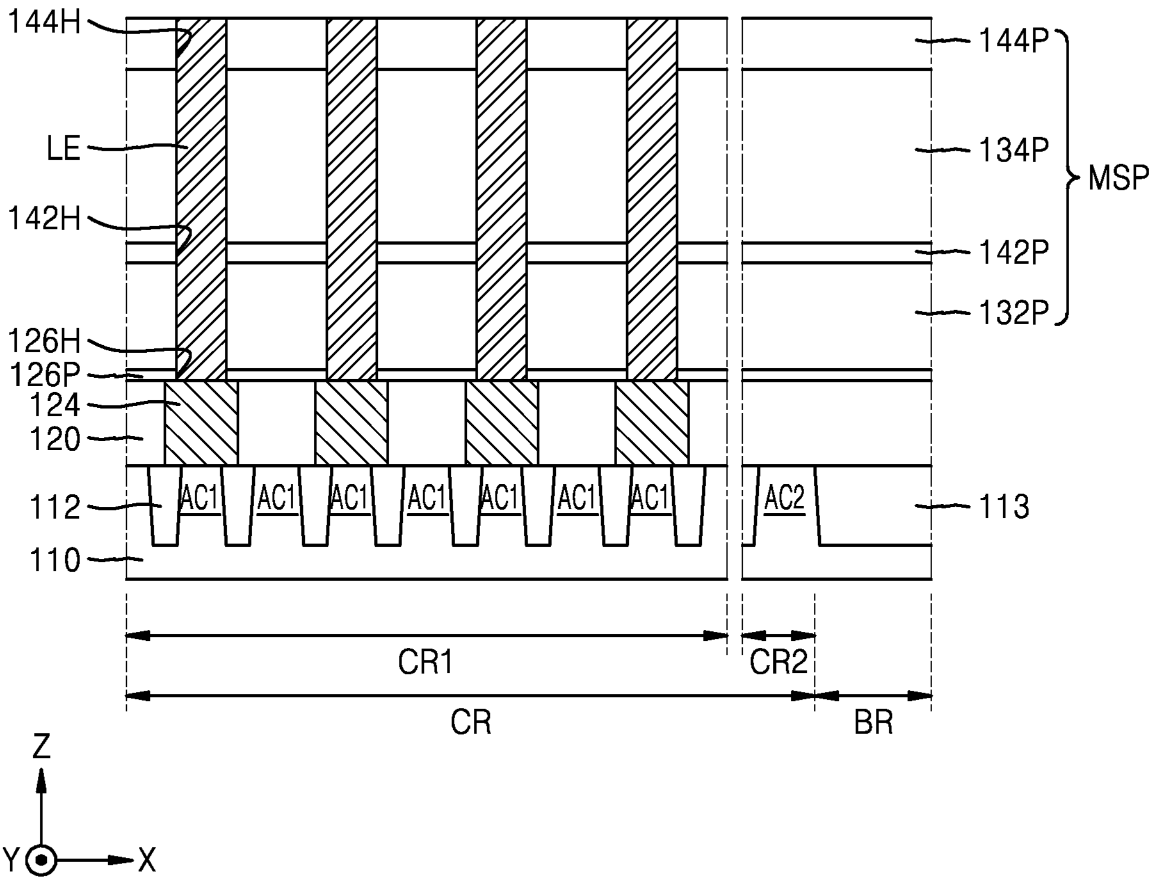

Referring to FIG. 10D, the mask pattern MP may be removed from the result of FIG. 10C, and a lower electrode LE filling the plurality of holes BH may be formed.

In embodiments, in order to form the lower electrode LE, a conductive layer covering an upper surface of the upper supporter 144P and filling the plurality of holes BH may be formed on the result of FIG. 10C. To form the conductive layer, a chemical vapor deposition (CVD) process, a plasma enhanced chemical vapor deposition (PECVD) process, a metal organic CVD (MOCVD) process, or an atomic layer deposition (ALD) process may be used. Thereafter, part of the conductive layer may be removed by using an etchback process or a chemical mechanical polishing (CMP) process, so that the upper surface of the upper supporter 144P may be exposed.

Figure 10E:
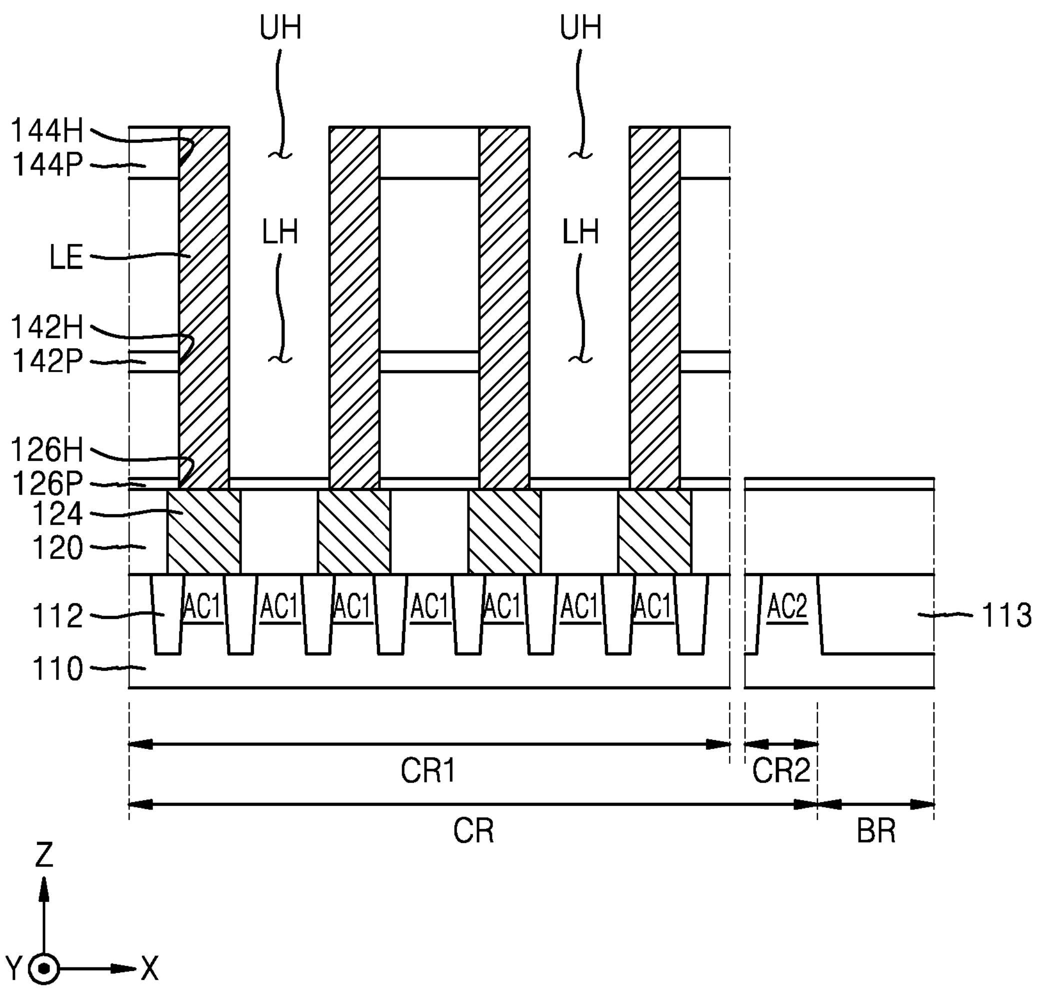

Referring to FIG. 10E, a plurality of upper holes UH may be formed by removing part of the upper supporter 144P within the cell area CR from the result of FIG. 10D, and then, the second mold pattern 134P may be wet removed through the plurality of upper holes UH. Thereafter, a plurality of lower holes LH may be formed by removing part of the lower supporter 142P within the cell area CR exposed through the plurality of upper holes UH, and then, the first mold pattern 132P may be wet removed through the plurality of lower holes LH, so that an upper surface of the first insulating pattern 126P within the cell area CR may be exposed. In other words, the upper surface of the first insulating pattern 126P within the first area CR1 and the second area CR2 may be exposed. After the first mold pattern 132P and the second mold pattern 134P are removed, sidewalls of the plurality of lower electrodes LE may be exposed.

The first mold pattern 132P, the lower supporter 142P, the second mold pattern 134P, and the upper supporter 144P within the connection area BR are all removed, and the upper surface of the first insulating pattern 126P may be exposed.

In embodiments, to wet remove the second mold pattern 134P and the first mold pattern 132P, an etchant including $NH_4F$, HF, and water may be used, but is not limited thereto.

Figure 10F:
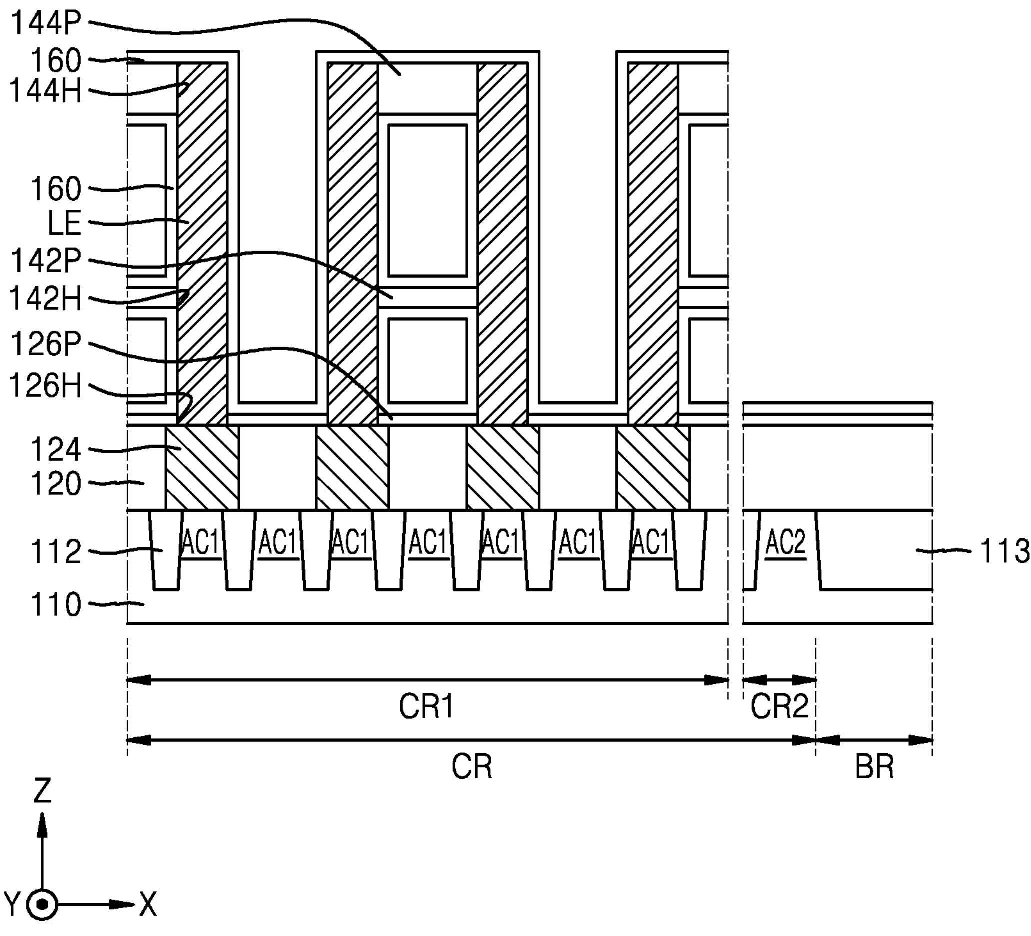

Referring to FIG. 10F, a process of forming a dielectric layer 160 covering the lower electrode LE exposed in the result of FIG. 10E may be performed. The dielectric layer 160 may be formed to cover not only the sidewalls of the lower electrode LE, but also exposed surfaces of each of the lower supporter 142P and the upper supporter 144P and exposed surfaces of the first insulating pattern 126P. To form the dielectric layer 160, a CVD process, a PECVD process, an MOCVD process, or an ALD process may be used.

After a deposition process for the dielectric layer 160 covering the lower electrode LE is performed, an annealing process may be performed. In embodiments, the annealing process may be performed at a temperature of about 200° C. to about 700° C. Crystallinity of the dielectric layer 160 may be improved by the annealing process, which may be performed in a state in which the dielectric layer 160 is formed.

Herein, the dielectric layer 160 is formed within the cell area CR and the connection area BR. However, in other embodiments, the dielectric layer 160 may be formed within the cell area CR, but may not be formed within the connection area BR.

Figure 10G:
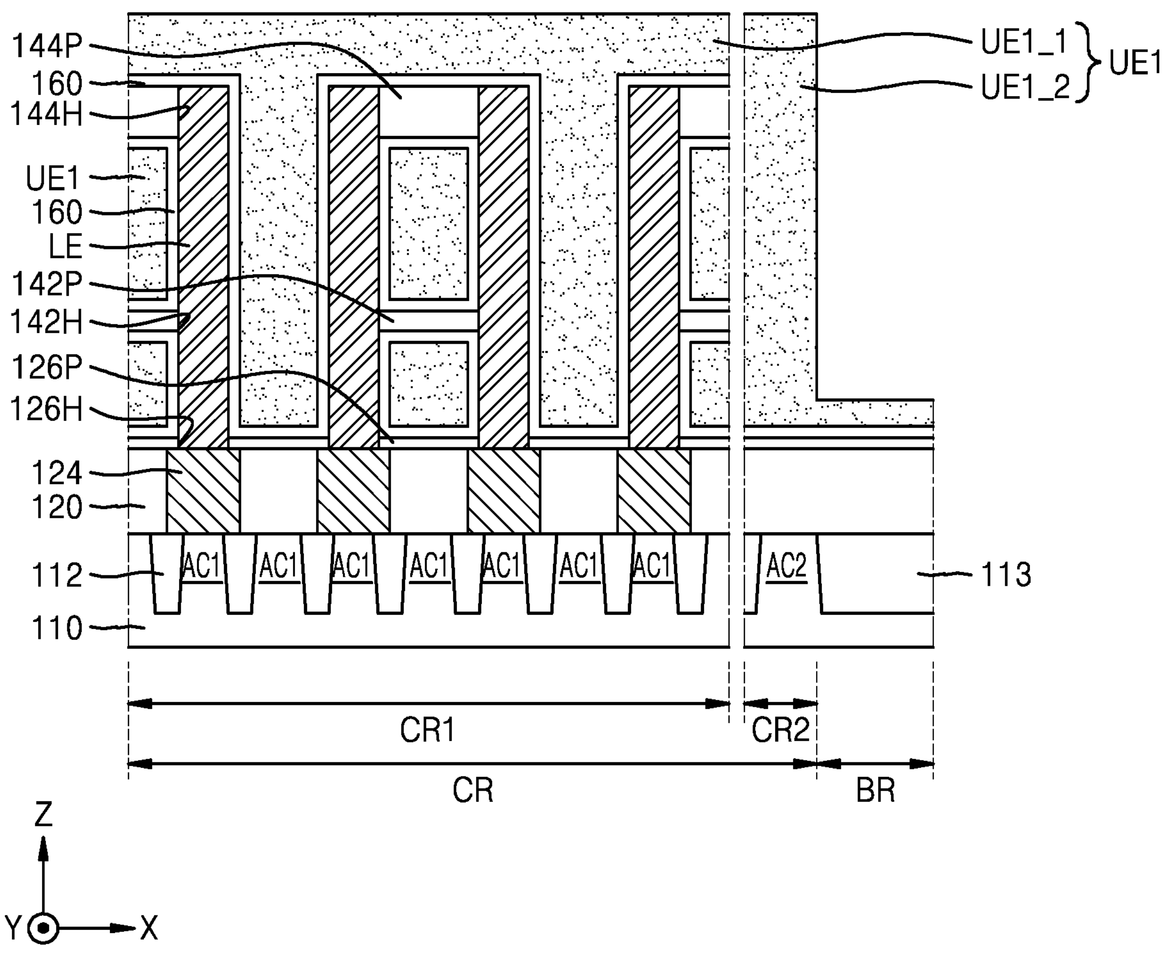

Referring to FIG. 10G, a first upper electrode UE1 covering the dielectric layer 160 in the result of FIG. 10F may be formed. In the cell area CR, the first upper electrode UE1 may be disposed on the lower electrode LE with the dielectric layer 160 therebetween. In the cell area CR, the first upper electrode UE1 may be disposed on the upper supporter 144P with the dielectric layer 160 therebetween. In the cell area CR, the first upper electrode UE1 may be disposed on the lower supporter 142P with the dielectric layer 160 therebetween. For example, in the second area CR2, a second portion UE1_2 of the first upper electrode UE1 may be disposed on the dielectric layer 160.

Herein, when the dielectric layer 160 is formed within the cell area CR and the connection area BR, the first upper electrode UE1 is also formed on the dielectric layer 160 formed within the connection area BR. However, in some other embodiments, the first upper electrode UE1 may be formed within the cell area CR, but may not be formed within the connection area BR.

Figure 10H:
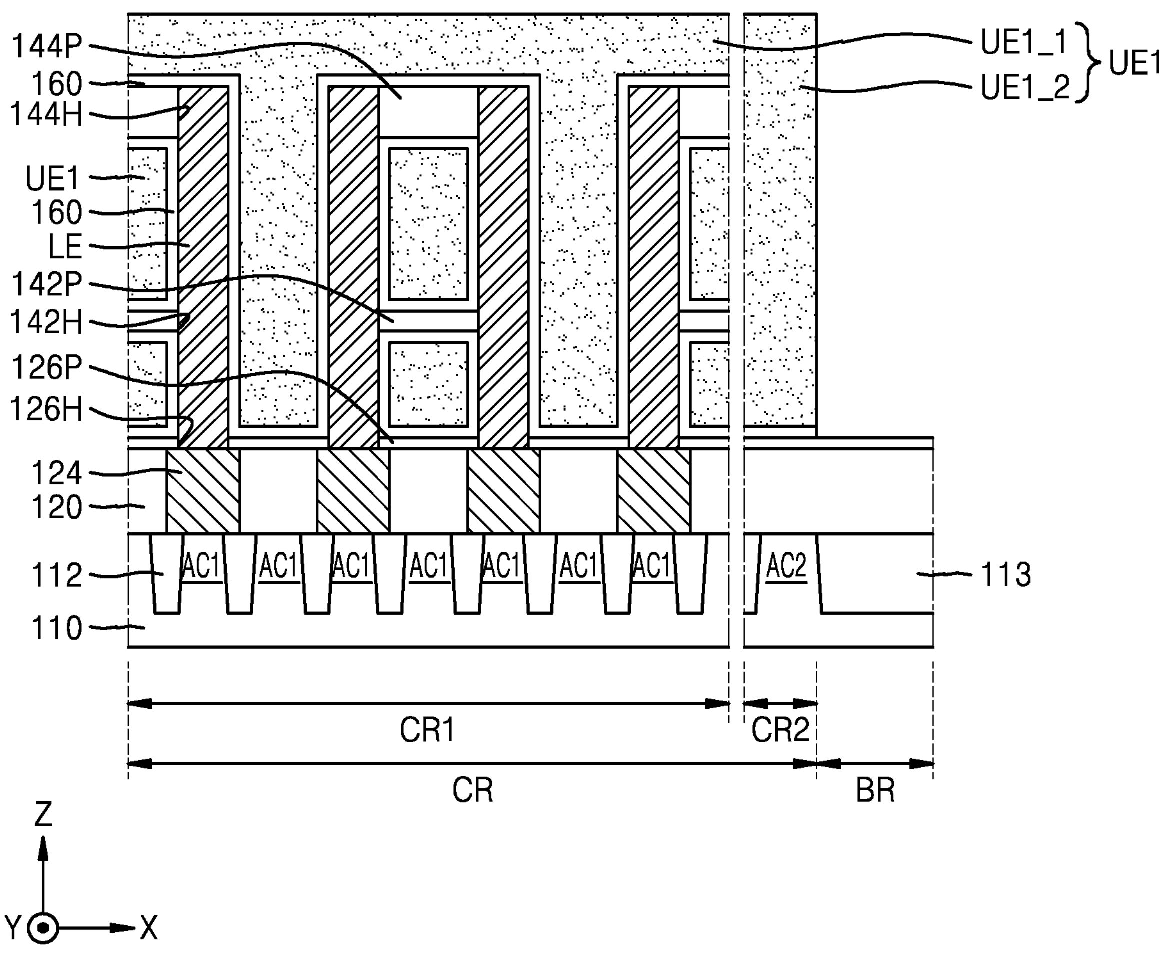

Referring to FIG. 10H, a mask pattern may be formed on the first upper electrode UE1 in the cell area CR of the result of FIG. 10G, and the dielectric layer 160 and the first upper electrode UE1 that are formed within the connection area BR may be removed. As the dielectric layer 160 and the first upper electrode UE1 formed within the connection area BR is removed, the dielectric layer 160 and the first upper electrode UE1 may be disposed only within the cell area CR. The cell area CR and the connection area BR may be distinguished from each other by the dielectric layer 160 and the first upper electrode UE1. For example, in the cell array area MCA described with reference to FIGS. 1 and 2, an area in which the dielectric layer 160 and the first upper electrode UE1 may include the cell area CR, and an area which surrounds the cell area CR without the dielectric layer 160 and the first upper electrode UE1 arranged therein may include the connection area BR.

Figure 10I:
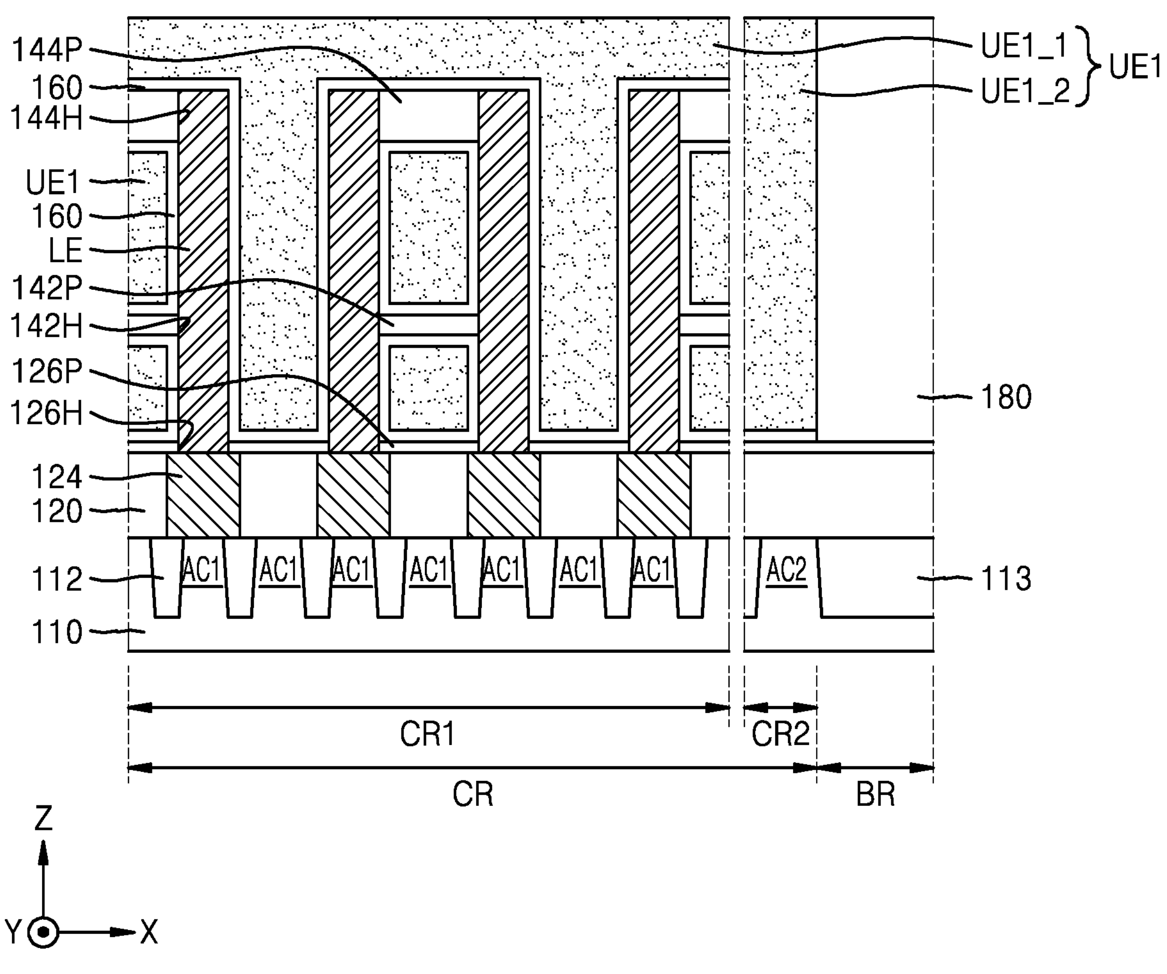

Referring to FIG. 10I, an insulating layer 180 surrounding the first upper electrode UE1 arranged in the cell area CR may be formed. For example, the insulating layer 180 may be formed within the connection area BR to horizontally surround the first upper electrode UE1. An upper surface of the insulating layer 180 may be at the same vertical level at which an upper surface of the second portion UE1_2 of the first upper electrode UE1 is located. In order to form the insulating layer 180, an insulating material may be applied onto the cell area CR and the connection area BR by using a process, such as CVD, PECVD, MOCVD, and ALD, and then, part of the insulating material may be removed by using an etchback process or a CMP process, so that the upper surface of the second portion UE1_2 of the first upper electrode UE1 may be exposed.

Figure 10J:
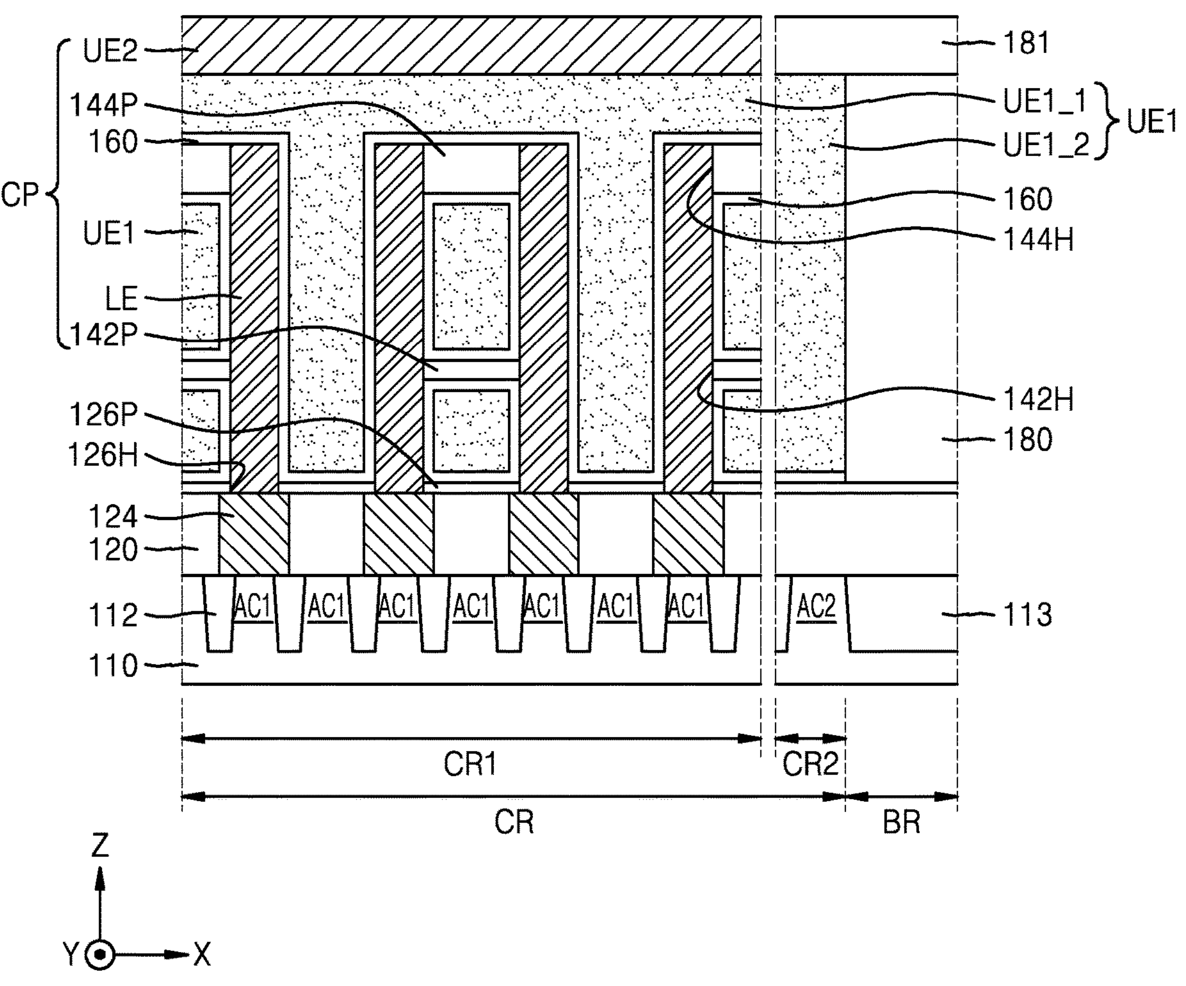

Referring to FIG. 10J, a second upper electrode UE2 disposed within the first upper electrode UE1 of the cell area CR may be formed. For example, the second upper electrode UE2 disposed on the first portion UE1_1 of the first upper electrode UE1 may be formed. For example, the second upper electrode UE2 may be formed within the first area CR1.

To form the second upper electrode UE2, a mask pattern may be formed within the second area CR2 and the connection area BR, and then, the second upper electrode UE2 may be formed within the first area CR1. Thereafter, the mask pattern formed within the second area CR2 and the connection area BR may be removed, and a first insulating liner 181 surrounding the second upper electrode UE2 may be formed.

Alternatively, to form the second upper electrode UE2, an insulating material may be applied onto the cell area CR and the connection area BR, and then, the insulating material formed within the first area CR1 may be removed, so that the first insulating liner 181 may be formed. Thereafter, the second upper electrode UE2 may be formed within the first area CR1.

Figure 10K:
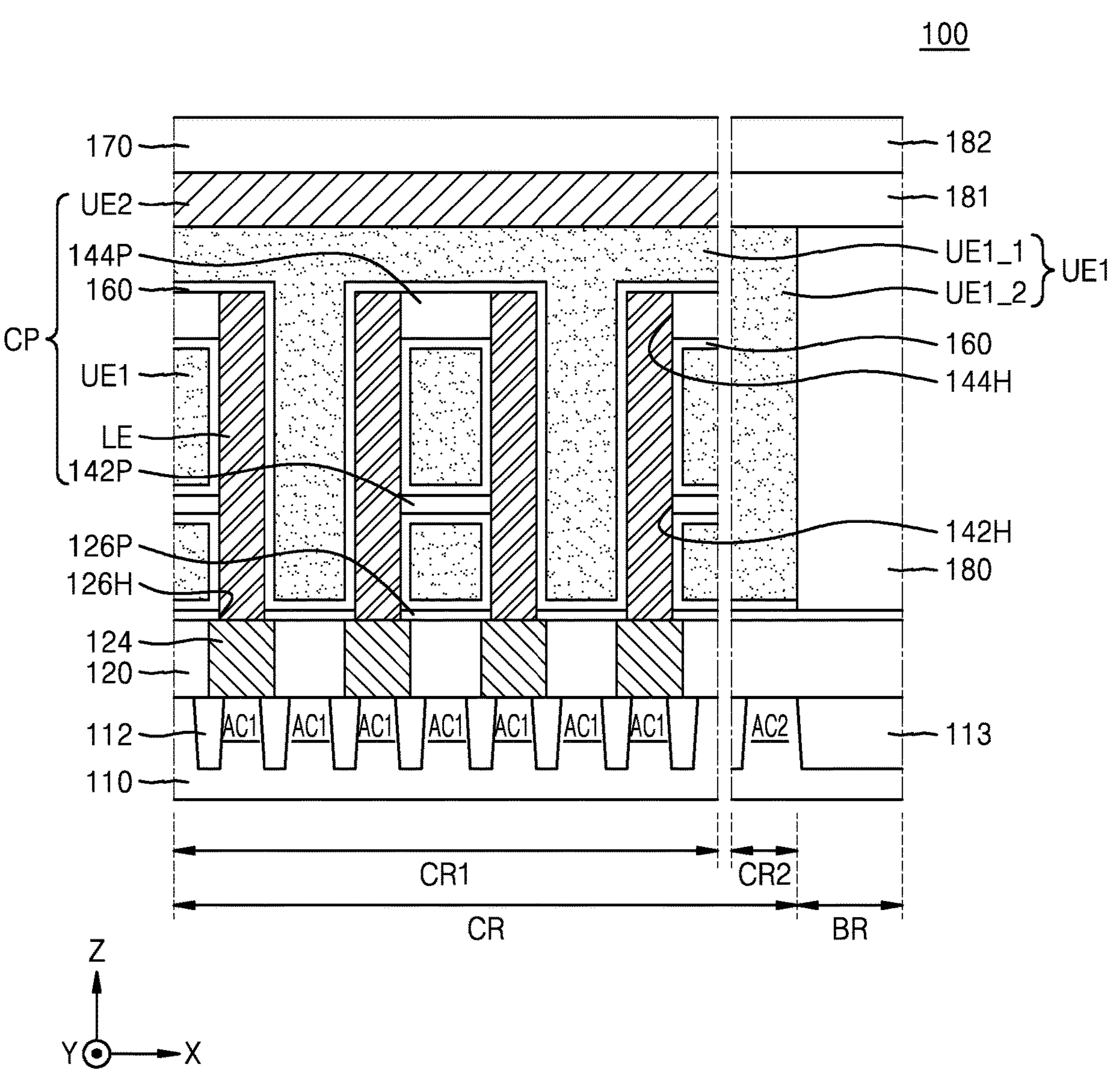

Referring to FIG. 10K, a protective layer 170 disposed on the second upper electrode UE2 of the cell area CR and including an insulating material may be formed. For example, the protective layer 170 disposed on the first portion UE1_1 of the first upper electrode UE1 may be formed. For example, the protective layer 170 may be formed within the first area CR1.

To form the protective layer 170, a mask pattern may be formed within the second area CR2 and the connection area BR, and then, the protective layer 170 may be formed within the first area CR1. Thereafter, the mask pattern formed within the second area CR2 and the connection area BR may be removed, and a second insulating liner 182 surrounding the protective layer 170 may be formed.

Alternatively, to form the protective layer 170, an insulating material may be applied onto the cell area CR and the connection area BR, and then, the insulating material formed within the first area CR1 may be removed, so that the second insulating liner 182 may be formed. Thereafter, the protective layer 170 may be formed within the first area CR1.

By the manufacturing method for the semiconductor device according to the inventive concept, the semiconductor device 100 including the second upper electrode UE2 disposed only on the first portion UE1_1 of the first upper electrode UE1 within the first area CR1 may be provided.

Although a method of manufacturing the semiconductor device 100 is described with reference to FIGS. 10A to 10K, a person having ordinary skill in the art could manufacture the semiconductor devices 100A, 100B, 100C, 100D, 100E, and 200 described with reference to FIGS. 4 to 9, within the spirit and scope of the inventive concept.

While the inventive concept has been particularly shown and described with reference to embodiments thereof, it will be understood that various changes in form and details may be made therein without departing from the spirit and scope of the following claims.

What is claimed is:

1. A semiconductor device comprising:

a substrate comprising a first area and a second area planarly surrounding the first area;

a lower electrode disposed on the first area of the substrate and extending in a vertical direction;

a supporter surrounding a sidewall of the lower electrode and supporting the lower electrode;

a first upper electrode covering the lower electrode, on the lower electrode, the first upper electrode comprising a first portion disposed within the first area and a second portion disposed within the second area;

a dielectric layer arranged between the lower electrode and the first upper electrode; and a second upper electrode disposed on the first portion of the first upper electrode, wherein the second upper electrode is not disposed on, and does not vertically overlap, the second portion of the first upper electrode.

2. The semiconductor device of claim 1, wherein the first upper electrode comprises one or more selected from among silicon-germanium (SiGe) and silicon (Si), and the second upper electrode comprises one or more selected from among tungsten (W), titanium nitride (TiN), and a combination thereof.

3. The semiconductor device of claim 1, wherein the second portion of the first upper electrode comprises a different material from a material of the second upper electrode.

4. The semiconductor device of claim 1, further comprising a protective layer on the second upper electrode, the protective layer comprising an insulating material.

5. The semiconductor device of claim 4, wherein the protective layer is not disposed on the second portion of the first upper electrode.

6. The semiconductor device of claim 1, wherein the second portion of the first upper electrode has an L-shaped cross-section.

7. The semiconductor device of claim 1, wherein the second portion of the first upper electrode comprises one or more protrusions protruding in a horizontal direction crossing the vertical direction, and wherein at least part of one protrusion of the one or more protrusions overlaps the supporter in the horizontal direction.

8. A semiconductor device comprising:

a substrate comprising a cell area and a connection area, the cell area comprising a first area and a second area, the second area being arranged horizontally between the first area and the connection area;

a plurality of conductive patterns disposed on the cell area of the substrate;

a plurality of lower electrodes respectively connected to the plurality of conductive patterns and each extending in a vertical direction;

a plurality of supporters surrounding each of a plurality of sidewalls of the plurality of lower electrodes and supporting the plurality of lower electrodes;

a dielectric layer disposed on the plurality of lower electrodes and the plurality of supporters and not disposed within the connection area;

a first upper electrode disposed on the dielectric layer, the first upper electrode comprising a first portion disposed within the first area and a second portion disposed within the second area; and a second upper electrode disposed within the first area and not disposed within the second area and the connection area.

9. The semiconductor device of claim 8, wherein the first upper electrode comprises one or more selected from among silicon-germanium (SiGe) and silicon (Si), and the second upper electrode comprises one or more selected from among tungsten (W), titanium nitride (TiN), and a combination thereof.

10. The semiconductor device of claim 8, wherein the second portion of the first upper electrode comprises one or more protrusions protruding in a horizontal direction crossing the vertical direction, and at least part of one protrusion of the one or more protrusions overlaps the plurality of supporters in the horizontal direction.

11. The semiconductor device of claim 8, wherein the second portion of the first upper electrode comprises a tail portion protruding toward the connection area.

12. The semiconductor device of claim 8, wherein an upper surface of the second portion of the first upper electrode comprises a portion that is at a vertical level that is different from a vertical level of an upper surface of the first portion of the first upper electrode.

13. The semiconductor device of claim 8, further comprising a protective layer disposed on the second upper electrode, the protective layer comprising an insulating layer, wherein the protective layer is not disposed on the second portion of the first upper electrode.

14. The semiconductor device of claim 8, wherein the plurality of conductive patterns are disposed on the first area and are not disposed on the second area.

15. A semiconductor device comprising:

a substrate comprising a cell area, a connection area, and a peripheral circuit area, the cell area comprising a first area and a second area, the second area being arranged between the first area and the connection area;

a cell transistor disposed within the cell area of the substrate;

a peripheral circuit disposed within the peripheral circuit area of the substrate;

a capacitor disposed within the cell area of the substrate and electrically connected to the cell transistor; and a peripheral circuit contact disposed within the peripheral circuit area of the substrate and electrically connected to the peripheral circuit, wherein the capacitor comprises:

a lower electrode disposed on the first area of the substrate and extending in a vertical direction;

a plurality of supporters surrounding a sidewall of the lower electrode and supporting the lower electrode;

a first upper electrode covering the lower electrode, on the lower electrode, the first upper electrode comprising a first portion disposed within the first area and a second portion disposed within the second area;

a dielectric layer arranged between the lower electrode and the first upper electrode; and a second upper electrode disposed on the first portion of the first upper electrode, wherein the second upper electrode is not disposed on, and does not vertically overlap, the second portion of the first upper electrode.

16. The semiconductor device of claim 15, wherein the first upper electrode comprises one or more selected from among silicon-germanium (SiGe) and silicon (Si), and the second upper electrode comprises one or more selected from among tungsten (W), titanium nitride (TiN), and a combination thereof.

17. The semiconductor device of claim 15, wherein the second portion of the first upper electrode comprises a different material from a material of the second upper electrode.

18. The semiconductor device of claim 15, wherein the second portion of the first upper electrode does not comprise tungsten (W), or titanium nitride (TiN).

19. The semiconductor device of claim 15, further comprising a protective layer disposed on the second upper electrode, the protective layer comprising an insulating material, wherein the protective layer is not disposed on the second portion of the first upper electrode.

20. The semiconductor device of claim 15, wherein the second portion of the first upper electrode comprises one or more selected from among one or more protrusions protruding toward the connection area in a horizontal direction crossing the vertical direction and a tail portion protruding toward the connection area in the horizontal direction, wherein at least part of one protrusion of the one or more protrusions overlaps the plurality of supporters in the horizontal direction, and wherein a lower surface of the tail portion is at the same vertical level at which a lower surface of the second portion of the first upper electrode is located.

* * * * *